US011776853B2

(12) United States Patent
Chen et al.

(10) Patent No.: US 11,776,853 B2
(45) Date of Patent: Oct. 3, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Hung-Hao Chen, Hsinchu (TW); Che-Cheng Chang, New Taipei (TW); Horng-Huei Tseng, Hsinchu (TW); Wen-Tung Chen, Taipei (TW); Yu-Cheng Liu, Zhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 82 days.

(21) Appl. No.: 17/646,763

(22) Filed: Jan. 3, 2022

(65) Prior Publication Data
US 2022/0130729 A1    Apr. 28, 2022

Related U.S. Application Data

(60) Division of application No. 16/742,630, filed on Jan. 14, 2020, now Pat. No. 11,217,485, which is a
(Continued)

(51) Int. Cl.
*H01L 21/8234* (2006.01)
*H01L 21/02* (2006.01)
(Continued)

(52) U.S. Cl.
CPC .. *H01L 21/823431* (2013.01); *H01L 21/0217* (2013.01); *H01L 21/02063* (2013.01);
(Continued)

(58) Field of Classification Search
CPC ....... H01L 21/823431; H01L 21/02063; H01L 21/02129; H01L 21/02164; H01L 21/0217; H01L 21/0273; H01L 21/31058; H01L 21/31116; H01L 21/31138; H01L 21/31144; H01L 21/76802; H01L 21/76814; H01L 21/823475; H01L 21/02271; H01L 21/823481; H01L 21/823821; H01L 23/525; H01L 24/05; H01L 24/13; H01L 2224/0345; H01L 2224/03452; H01L 2224/0401; H01L 2224/05124; H01L 2224/05147; H01L 2224/05166; H01L 2224/05186;
(Continued)

(56) References Cited

U.S. PATENT DOCUMENTS 6,346,489 B1   2/2002   Cohen et al.
6,352,921 B1   3/2002   Han
(Continued)

FOREIGN PATENT DOCUMENTS

CN        1871554 A        11/2006

*Primary Examiner* — Robert G Bachner
(74) *Attorney, Agent, or Firm* — Slater Matsil, LLP

(57) ABSTRACT

A semiconductor device and method of manufacture are provided in which a passivation layer is patterned. In embodiments, by-products from the patterning process are removed using the same etching chamber and at the same time as the removal of a photoresist utilized in the patterning process. Such processes may be used during the manufacturing of FinFET devices.

20 Claims, 28 Drawing Sheets

Related U.S. Application Data continuation of application No. 15/420,280, filed on Jan. 31, 2017, now Pat. No. 10,535,566.

(60) Provisional application No. 62/328,921, filed on Apr. 28, 2016.

(51) Int. Cl.

| | |
|---|---|
| *H01L 21/311* | (2006.01) |
| *H01L 21/768* | (2006.01) |
| *H01L 21/027* | (2006.01) |
| *H01L 21/3105* | (2006.01) |
| *H01L 21/8238* | (2006.01) |
| *H01L 23/00* | (2006.01) |
| *H01L 23/525* | (2006.01) |

(52) U.S. Cl.
CPC .... *H01L 21/0273* (2013.01); *H01L 21/02129* (2013.01); *H01L 21/02164* (2013.01); *H01L 21/31058* (2013.01); *H01L 21/31116* (2013.01); *H01L 21/31138* (2013.01); *H01L 21/31144* (2013.01); *H01L 21/76802* (2013.01); *H01L 21/76814* (2013.01); *H01L 21/823475* (2013.01); H01L 21/02271 (2013.01); H01L 21/823481 (2013.01); H01L 21/823821 (2013.01); H01L 23/525 (2013.01); H01L 24/05 (2013.01); H01L 24/13 (2013.01); H01L 2224/0345 (2013.01); H01L 2224/03452 (2013.01); H01L 2224/0401 (2013.01); H01L 2224/05124 (2013.01); H01L 2224/05147 (2013.01); H01L 2224/05166 (2013.01); H01L 2224/05186 (2013.01); H01L 2224/05567 (2013.01); H01L 2224/05624 (2013.01); *H01L 2224/05647* (2013.01); *H01L 2224/131* (2013.01); *H01L 2224/13147* (2013.01)

(58) Field of Classification Search
CPC . H01L 2224/05567; H01L 2224/05624; H01L 2224/05647; H01L 2224/131; H01L 2224/13147; H01L 29/66795
See application file for complete search history.

(56) References Cited

U.S. PATENT DOCUMENTS

| | | |
|---|---|---|
| 6,440,864 B1 | 8/2002 | Kropewnicki et al. |
| 7,045,464 B1 | 5/2006 | Biolsi et al. |
| 7,470,616 B1 | 12/2008 | Akinmade-Yusuff et al. |
| 7,637,269 B1 | 12/2009 | Zin et al. |
| 2001/0047979 A1 | 12/2001 | Wang et al. |
| 2003/0040192 A1 | 2/2003 | Kanegae |
| 2005/0136681 A1 | 6/2005 | Balasubramaniam et al. |
| 2005/0239290 A1 | 10/2005 | Hsu |
| 2005/0272237 A1 | 12/2005 | Hautala et al. |
| 2006/0144817 A1 | 7/2006 | Balasubramaniam et al. |
| 2006/0199370 A1 | 9/2006 | Dai et al. |
| 2007/0048447 A1 | 3/2007 | Lee et al. |
| 2007/0134922 A1 | 6/2007 | Mori et al. |
| 2007/0269975 A1 | 11/2007 | Savas et al. |
| 2008/0280436 A1 | 11/2008 | Wang |
| 2011/0217844 A1 | 9/2011 | Satou |
| 2011/0263127 A1 | 10/2011 | Chen et al. |
| 2013/0334619 A1 | 12/2013 | Merz et al. |
| 2015/0076713 A1 | 3/2015 | Tsai et al. |
| 2016/0056048 A1 | 2/2016 | Honda |
| 2016/0190432 A1 | 6/2016 | Shum et al. |
| 2016/0268319 A1 | 9/2016 | Long et al. |
| 2018/0011356 A1 | 1/2018 | Kong | ns # SEMICONDUCTOR DEVICE AND METHOD OF MANUFACTURE

PRIORITY CLAIM AND CROSS-REFERENCE

This application is a divisional of U.S. patent application Ser. No. 16/742,630, filed on Jan. 14, 2020, entitled "Semiconductor Device and Method of Manufacture," which is a continuation of U.S. patent application Ser. No. 15/420,280, filed on Jan. 31, 2017, now U.S. Pat. No. 10,535,566 issued Jan. 14, 2020, entitled "Semiconductor Device and Method of Manufacture," which claims the benefit of U.S. Provisional Application No. 62/328,921 filed on Apr. 28, 2016, entitled "Semiconductor Device and Method of Manufacture," which applications are hereby incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

However, merely decreasing the minimum feature size of transistors, diodes, resistors, capacitors and the like are merely one aspect that can be improved in the attempts to reduce the overall size of semiconductors devices. Other aspects that are currently under review include other aspects of the semiconductor devices. Improvements in these other structures are being investigated for reductions in size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
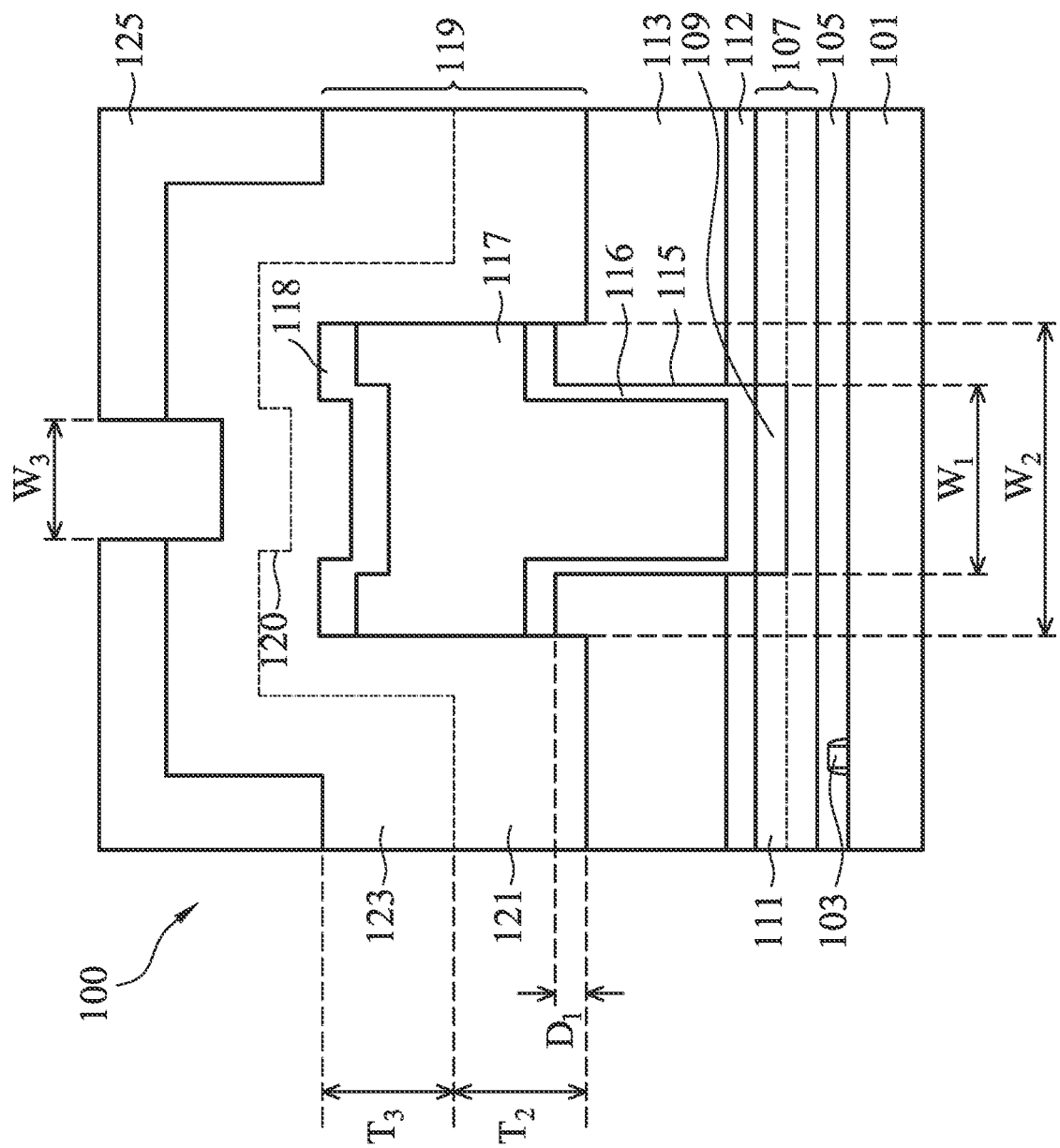
FIG. 1 illustrates a semiconductor device with a first passivation layer and a second passivation layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a semiconductor device 100 with a substrate 101, active devices 103 on the substrate 101, an interlayer dielectric (ILD) layer 105 over the active devices 103, and metallization layers 107 over the ILD layer 105. The substrate 101 may be substantially conductive or semiconductive with an electrical resistance of less than $10^3$ ohm-meter and may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Additionally, the substrate 101 at this point in the process may be part of a semiconductor wafer (the full wafer of which is not illustrated in FIG. 1) that will be singulated in a later step.

The active devices 103 are represented in FIG. 1 as a single transistor. However, as one of skill in the art will recognize, a wide variety of active and passive devices such as capacitors, resistors, inductors and the like may be used to generate the desired structural and functional requirements of the design for the semiconductor device 100. The active devices 103 may be formed using any suitable methods either within or else on the surface of the substrate 101.

The ILD layer 105 may comprise a material such as boron phosphorous silicate glass (BPSG), although any suitable dielectrics may be used. The ILD layer 105 may be formed using a process such as PECVD, although other processes, such as LPCVD, may alternatively be used. The ILD layer 105 may be formed to a thickness of between about 100 Å and about 3,000 Å.

The metallization layers 107 are formed over the substrate 101, the active devices 103, and the ILD layer 105 and are designed to connect the various active devices 103 to form functional circuitry. While illustrated in FIG. 1 as two layers, the metallization layers 107 are formed of alternating layers of dielectric and conductive material and may be formed through any suitable process (such as deposition, damascene, dual damascene, etc.). In an embodiment there may be four layers of metallization separated from the substrate 101 by the ILD layer 105, but the precise number of metallization layers 107 is dependent upon the design of the semiconductor device 100.

At the top of the metallization layers 107 there is a top metal layer 109 surrounded by a top dielectric layer 111. In an embodiment the top metal layer 109 comprises the conductive material, such as copper or other suitable conductor, formed within the top dielectric layer 111, which may be any suitable dielectric, such as a low-k dielectric material. The top dielectric layer 111 may be initially formed over the remainder of the metallization layers 107 and then the top metal layer 109 may be formed within the top dielectric layer 111 using, e.g., a damascene or dual damascene process, although any suitable process or materials may be used.

A first etch stop layer 112 is used to protect the underlying structures and provide a control point for a subsequent etching process through, e.g., the first passivation layer 113. In one embodiment, the first etch stop layer 112 may be formed of silicon nitride using plasma enhanced chemical vapor deposition (PECVD), although other materials such as nitride, carbide, boride, combinations thereof, or the like, and alternative techniques of forming the first etch stop layer 112, such as low pressure CVD (LPCVD), PVD, or the like, could alternatively be used. The first etch stop layer 112 may have a thickness of between about 50 Å and about 2,000 Å, such as about 200 Å.

A first passivation layer 113 may be formed on the substrate 101 over the first etch stop layer 112. The first passivation layer 113 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 113 may be formed through a process such as chemical vapor deposition (CVD), although any suitable process may be utilized, and may have a thickness of between about 0.5 µm and about 5 µm, such as about 9.75 KÅ.

After the first passivation layer 113 has been formed, first openings 115 (one of which is illustrated in FIG. 1) may be made through the first passivation layer 113 by removing portions of the first passivation layer 113 to expose at least a portion of the top metal layer 109. The first openings 115 allow for contact between the top metal layer 109 and a first conductive connection 117. The first openings 115 may be formed using a suitable photolithographic mask and etching process, although any suitable process to expose portions of the top metal layer 109 may be used, and the first openings 115 may be formed to have a first width $W_1$ of between about 1 µm and about 10 µm, such as about 2 µm.

Once the first openings 115 have been made, the first conductive connection 117 (e.g., an external contact or a redistribution layer) may be formed. In an embodiment the first conductive connection 117 may be initiated by first forming a first barrier layer 116. In an embodiment the first barrier layer 116 may comprise a barrier material such as titanium, titanium nitride, combinations of these, or the like, and may be formed using a process such as chemical vapor deposition (CVD), physical vapor deposition (PVD), atomic layer deposition (ALD), or the like. The first barrier layer 116 may be formed to have a thickness of between about 0.1 µm and about 20 µm, such as about 0.5 µm.

The first conductive connection 117 may comprise an aluminum/copper alloy, but other materials, such as aluminum or copper, may alternatively be used. The first conductive connection 117 may be formed using a deposition process, such as sputtering, to form a layer of material (not separately shown in FIG. 1) and portions of the layer of material may then be removed through a suitable process (such as photolithographic masking and etching, described further below) to form the first conductive connection 117. However, any other suitable process may be utilized to form the first conductive connection 117. The first conductive connection 117 may be formed to have a first thickness $T_1$ over the first passivation layer 113 of between about 2 KÅ and about 20 KÅ, such as about 8.5 KÅ.

Once the first conductive connection 117 has been formed, a capping layer 118 may be placed over the first conductive connection 117 to help act as a hard mask for a patterning of the first conductive connection as well as to act as an etch stop layer for a subsequent exposure. In an embodiment the capping layer 118 may comprise one or more layers of dielectric materials, such as silicon oxynitride, silicon nitride, silicon oxycarbide, silicon carbide, combinations thereof, and multi-layers thereof formed by, for example, using suitable deposition techniques such as sputtering, CVD, and the like.

Once the capping layer 118 has been placed, the capping layer 118 may be patterned and then used as a hard mask to help pattern the first conductive connection 117. In an embodiment the capping layer 118 may be patterned by placing, exposing, and developing a photoresist (not separately illustrated in FIG. 1) and then performing a dry etch, such as a reactive ion etch, to remove exposed portions of the capping layer 118. Once the capping layer 118 has been patterned, the underlying first conductive connection 117 and the first barrier layer 116 may be patterned using the capping layer 118 as a hard mask. In an embodiment the first conductive connection 117 and the first barrier layer 116 may be patterned with a dry etch, such as a reactive ion etch, to have a second width $W_2$ of between about 1.5 µm and about 20 µm, such as about 3 µm.

Additionally, if desired, the first passivation layer 113 may also be etched at this point, with either a continuation of the previous etch or a separate etching step, to reduce the thickness of the first passivation layer 113 that is exposed by the first conductive connection 117. In an embodiment the first passivation layer 113 may be recessed a first distance Di of between about 200 Å and about 10000 Å, such as about 800 Å. However, any suitable distance may be utilized.

FIG. 1 also illustrates a formation of a second passivation layer 119 over the first passivation layer 113 and the first conductive connection 117 in order to provide protection and isolation for the first conductive connection 117 and the other underlying structures. In an embodiment the second passivation layer 119 may be a composite layer (represented in FIG. 1 by the dashed line labeled 120) with a bottom portion 121 of the second passivation layer 119 and a top portion 123 of the second passivation layer 119. In an embodiment the bottom portion 121 of the second passivation layer 119 may be a dielectric polymer material such as undoped silicate glass (USG), although any suitable material, such as polybenzoxazole (PBO), polyimide or a polyimide derivative, may alternatively be utilized. The bottom portion 121 of the second passivation layer 119 may be placed using, e.g., a spin-coating process to a second thickness $T_2$ of between about 2 KÅ and about 20 KÅ, such as about 4 KÅ, although any suitable method and thickness may alternatively be used.

The top portion 123 of the second passivation layer 119 may be placed over the bottom portion 121 of the second passivation layer 119. In an embodiment the top portion 123 of the second passivation layer 119 may be a dielectric material such as silicon nitride, or the like, although any suitable material may be utilized. The top portion 123 of the second passivation layer 119 may be placed using, e.g., a chemical vapor deposition or physical vapor deposition process to a thickness of between about 2 KÅ and about 20 KÅ, such as about 6 KÅ, although any suitable method and thickness may alternatively be used.

Once the second passivation layer 119 has been formed, a first photoresist 125 is placed on the second passivation layer 119 and patterned to expose the second passivation layer 119. In an embodiment the first photoresist 125 may be placed on the second passivation layer 119 using, e.g., a spin coating technique to a height of between about 50 µm and about 250 µm, such as about 120 µm. Once in place, the first photoresist 125 may then be patterned by exposing the first photoresist 125 to a patterned energy source (e.g., a patterned light source) so as to induce a chemical reaction, thereby inducing a physical change in those portions of the first photoresist 125 exposed to the patterned light source. A developer is then applied to the exposed first photoresist 125 to take advantage of the physical changes and selectively remove either the exposed portion of the first photoresist 125 or the unexposed portion of the first photoresist 125, depending upon the desired pattern. In an embodiment the pattern formed into the first photoresist 125 has a third width $W_3$ of between about 1 µm and about 10 µm, such as about 1.5 µm.

Figure 2:
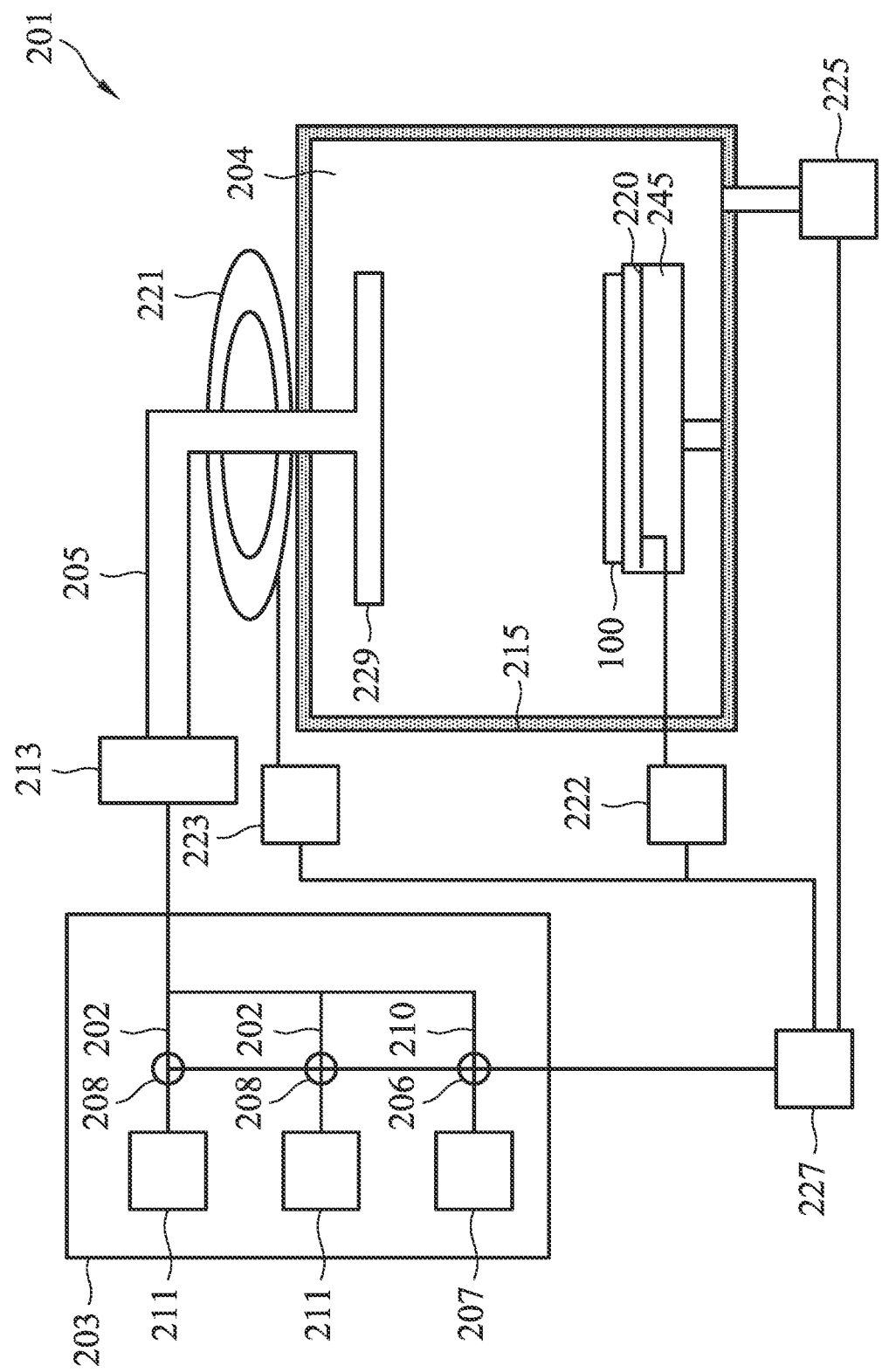
FIG. 2 illustrates an etching chamber that may be used to pattern the second passivation layer in accordance with some embodiments.

FIG. 2 illustrates an etching system 201 that may be used in order to pattern the second passivation layer 119 and the capping layer 118 using the first photoresist 125 as a mask. In an embodiment the etching system 201 may comprise an etchant delivery system 203 that may deliver one or more gaseous etchants to an etching chamber 204. The etchant delivery system 203 supplies the various desired etchants to the etching chamber 204 through an etchant controller 213 and a manifold 205. The etchant delivery system 203 may also help to control the flow rate of the etchant into the etching chamber 204 by controlling the flow and pressure of a carrier gas through the etchant delivery system 203.

In an embodiment the etchant delivery system 203 may include a plurality of etchant suppliers 211 along with a carrier gas supply 207. Additionally, while only two etchant suppliers 211 are illustrated in FIG. 2, this is done merely for clarity, as any suitable number of etchant suppliers 211, such as one etchant supplier 211 for each etchant desired to be used within the etching system 201 may be used. For example, in an embodiment in which five separate etchants will be utilized, there may be five separate etchant suppliers 211.

Each of the individual etchant suppliers 211 may be a vessel, such as a gas storage tank, that is located either locally to the etching chamber 204 or remotely from the etching chamber 204. Alternatively, the etchant supplier 211 may be a facility that independently prepares and delivers the desired etchants. Any suitable source for the desired etchants may be utilized as the etchant supplier 211, and all such sources are fully intended to be included within the scope of the embodiments.

In an embodiment the individual etchant suppliers 211 supply an etchant to the etchant controller 213 through first lines 202 with first valves 208. The first valves 208 are controlled by a controller 227 that controls and regulates the introduction of the various etchants and carrier gases to the etching chamber 204.

A carrier gas supply 207 may supply a desired carrier gas, or diluent gas, that may be used to help push or "carry" the various desired etchants to the etching chamber 204. The carrier gas may be an inert gas or other gas that does not react with the etchant itself or with by-products from the etchant's reactions. For example, the carrier gas may be nitrogen ($N_2$), helium (He), argon (Ar), combinations of these, or the like, although other suitable carrier gases may alternatively be utilized.

The carrier gas supply 207, or diluent supply, may be a vessel, such as a gas storage tank, that is located either locally to the etching chamber 204 or remotely from the etching chamber 204. Alternatively, the carrier gas supply 207 may be a facility that independently prepares and delivers the carrier gas to the etchant controller 213. Any suitable source for the carrier gas may be utilized as the carrier gas supply 207, and all such sources are fully intended to be included within the scope of the embodiments. The carrier gas supply 207 may supply the desired carrier gas to the etchant controller 213 through a second line 210 with a second valve 206 that connects the carrier gas supply 207 to the first lines 202. The second valve 206 is also controlled by the controller 227 that controls and regulates the introduction of the various etchants and carrier gases to the etching chamber 204. Once combined, the lines may be directed towards the etchant controller 213 for a controlled entry into the etching chamber 204.

The etching chamber 204 may be any desired shape that may be suitable for dispersing the etchant and contacting the etchant with the semiconductor device 100. In the embodiment illustrated in FIG. 2, the etching chamber 204 has a cylindrical sidewall and a bottom. However, the etching chamber 204 is not limited to a cylindrical shape, and any other suitable shape, such as a hollow square tube, an octagonal shape, or the like, may alternatively be utilized. Furthermore, the etching chamber 204 may be surrounded by an etchant chamber housing 215 made of material that is inert to the various process materials. As such, while the etchant chamber housing 215 may be any suitable material that can withstand the chemistries and pressures involved in the etching process, in an embodiment the etchant chamber housing 215 may be steel, stainless steel, nickel, aluminum, alloys of these, combinations of these, and the like.

Additionally, the etching chamber 204 and the mounting platform 245 may be part of a cluster tool system (not shown). The cluster tool system may be used in conjunction with an automated handling system in order to position and place the semiconductor device 100 into the etching chamber 204 prior to the etching process, position and hold the semiconductor device 100 during the etching processes, and remove the semiconductor device 100 from the etching chamber 204 after the etching processes.

Within the etching chamber 204 is located a mounting platform 245 in order to position and control the semiconductor device 100 during the etching process. The mounting platform 245 may hold the semiconductor device 100 using a combination of clamps, vacuum pressure, and/or electrostatic forces, and may also include heating and cooling mechanisms in order to control the temperature of the semiconductor device 100 during the processes. In a particular embodiment the mounting platform 245 may comprise four cooling zones, such as an inner temperature zone, a middle inner temperature zone, a middle outer temperature zone, and an outer temperature zone (not individually illustrated) in order to heat and cool the semiconductor device 100 during the etching process. The various temperature zones may use gaseous or liquid heat transfer materials to precisely control the temperature of the semiconductor device 100 during the etching process, although any suitable number of heating or cooling zones may alternatively be utilized.

The mounting platform 245 may additionally comprise a first electrode 220 coupled to a first RF generator 222. The first electrode 220 may be electrically biased by the first RF generator 222 (under control of the controller 227) at a RF voltage during the etching process. By being electrically biased, the first electrode 220 is used to provide a bias to the incoming etchants and assist to ignite them into a plasma.

Additionally, the first electrode 220 is also utilized to maintain the plasma during the etching process by maintaining the bias.

Furthermore, while a single mounting platform 245 is illustrated in FIG. 2, this is merely intended for clarity and is not intended to be limiting. Rather, any number of mounting platforms 245 may additionally be included within the etching chamber 204. As such, multiple semiconductor substrates may be etched during a single etching process.

Additionally, the etching chamber 204 comprises a showerhead 229. In an embodiment the showerhead 229 receives the various etchants from the manifold 205 and helps to disperse the various etchants into the etching chamber 204. The showerhead 229 may be designed to evenly disperse the etchants in order to minimize undesired process conditions that may arise from uneven dispersal. In an embodiment the showerhead 229 may have a circular design with openings dispersed evenly around the showerhead 229 to allow for the dispersal of the desired etchants into the etching chamber 204.

The etching chamber 204 also comprises an upper electrode 221, for use as a plasma generator. In an embodiment the plasma generator may be a transformer coupled plasma generator and may be, e.g., a coil. The coil may be attached to a second RF generator 223 that is utilized to provide power to the upper electrode 221 (under control of the controller 227) in order to ignite the plasma during introduction of the reactive etchants.

However, while the upper electrode 221 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may alternatively be utilized. All such methods are fully intended to be included within the scope of the embodiments.

The etching chamber 204 may also be connected to a vacuum pump 225. In an embodiment the vacuum pump 225 is under the control of the controller 227, and may be utilized to control the pressure within the etching chamber 204 to a desired pressure. Additionally, once the etching process is completed, the vacuum pump 225 may be utilized to evacuate the etching chamber 204 in preparation for removal of the semiconductor device 100.

Figure 3A:
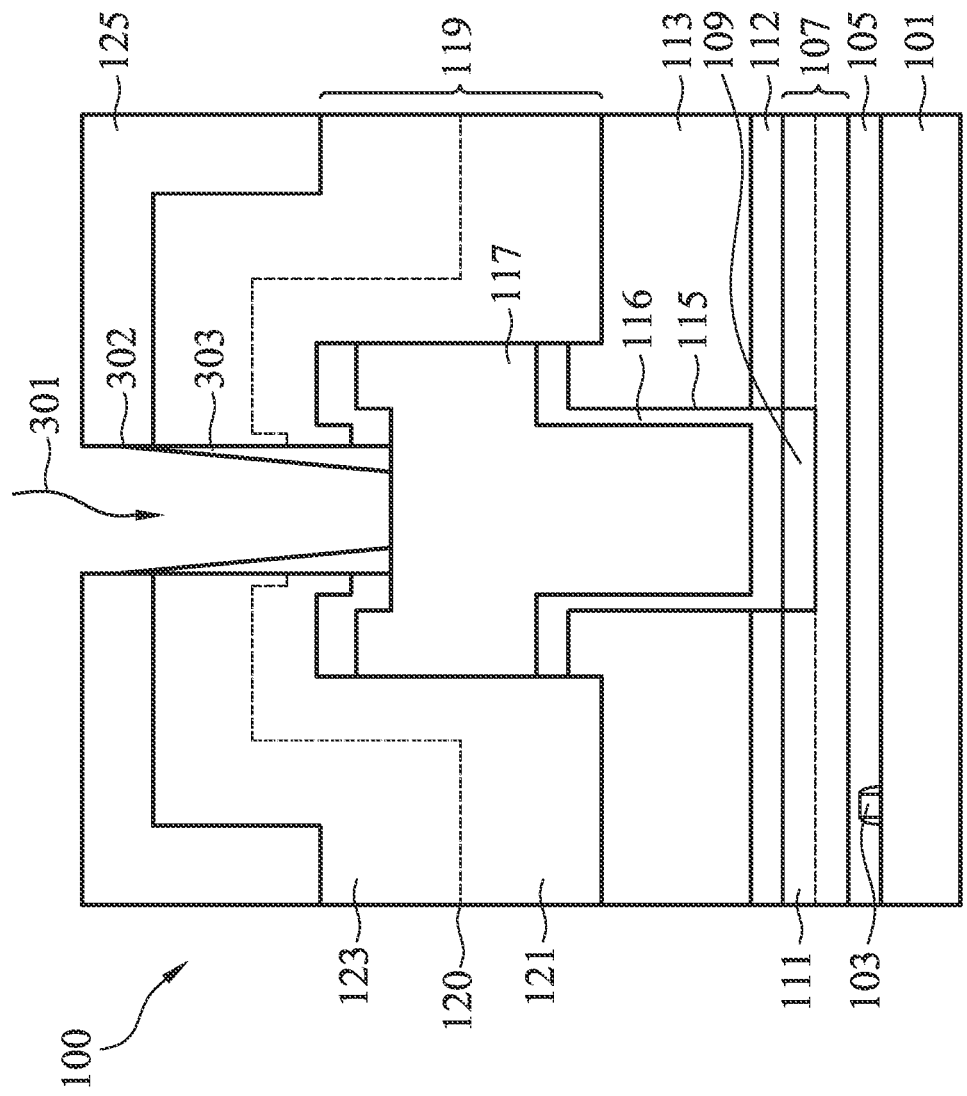
FIGS. 3A-3B illustrate a removal of by-products from the etching process in accordance with some embodiments.

FIG. 3A illustrates a beginning of an etching process (represented in FIG. 3A by the wavy arrow labeled 301) that may be used to form a first opening 302 and transfer the pattern of the first photoresist 125 to the second passivation layer 119 and the capping layer 118. In an embodiment the etching process 301 may be initiated by placing the desired etchants into the etchant suppliers 211 while placing the desired diluent into the carrier gas supply 207. As such, while the precise etchants and carrier gases are dependent at least in part upon the materials of the second passivation layer 119 and the capping layer 118, in a particular embodiment in which the second passivation layer 119 is a composite layer of silicon nitride and USG and the capping layer 118 is silicon oxynitride, $CF_4$, $CHF_3$, oxygen ($O_2$), nitrogen, hydrogen, combinations of these, or the like, may be placed within the etchant suppliers 211, while the carrier gas may be a non-reactive gas such as argon, helium, combinations of these, or the like. However, any suitable etchants and diluents may be utilized.

In a particular embodiment, the etching process 301 may comprise a number of individual steps in order to transfer the pattern. For example, the etching process 301 may comprise a chucking step, a main etching step, and an overetching step. The chucking step may be used to prepare the etching chamber for the etching process, and may begin with a chucking stabilization step that brings the pressure within the etching chamber 204 to a pressure of between about 20 mT and about 800 mT, such as about 300 mT and the gas ratio may be set to between 5% and about 95%, such as about 50. The chucking stabilization step may also set a carrier gas (e.g., argon) flow rate of between about 50 sccm and about 2000 sccm, such as about 1000 sccm. The B.P. pressure may be set to less than about 50 Torr, such as about 0 Torr, while the temperature T/B may be set to 120/20, the power at both 60 MHz and 2 MHz may be set to 0, and the stabilization may be maintained with enough time to stabilize, such as about 15 seconds.

After the chucking stabilization step has stabilized the environment within the etching chamber 204, the controller 227 may begin to apply power in a series of steps. In an embodiment the controller 227 may begin by first applying an RF power at 60 MHz (the source power at the upper electrode 221) of between about 20 and about 1000, such as about 200 and applying an RF power at 2 MHz (the bias power at the first electrode 220) of between about 20 and about 1000, such as about 200, for a time period of between about 1 s and about 100 s, such as about 1 second. In the next step, the controller 227 may then set the ESC HV to between about 500 and about 5000, such as about 600, for about 1 s and about 100 s, such as about 1 second. Finally, in the next step, the controller may set the B.P. to between about 5 and about 100, such as about 10 Torr for a time of between about 1 s and about 100 s, such as about 2 seconds.

After the chucking steps have been completed, the main etching process may be initiated by the controller 227. In an embodiment the controller 227 will begin with an etching stabilization step, in which the pressure is reduced and the flow rates of the desired etchants are stabilized prior to ignition of the plasma (wherein the RF power at both the upper electrode 221 and the first electrode 220 is turned off for the stabilization step). In an embodiment in which $CF_4$, $CHF_3$ and $O_2$ are used as the etchants, the pressure within the etching chamber 204 may be reduced to be between about 20 mT and about 500 mT, such as about 100 mT, the $CF_4$ may be initiated at a flow rate of between about 20 sccm and about 800 sccm, such as about 335 sccm, the $CHF_3$ is set to a flow rate of between about 20 sccm and about 800 sccm, such as about 165 sccm, and the $O_2$ is set to between about 20 sccm and about 800 sccm, such as about 100. The carrier gas (e.g., argon) is set to between about 20 sccm and about 800 sccm, such as about 250 sccm. Additionally in the stabilizing step the controller 227 may set the B.P. to between about 5 and about 100 Torr, such as about 30 Torr, the ESC HV to between about 500 and about 5000, such as about 850, and may maintain these conditions until the etching chamber has stabilized, such as between about 1 s and about 100 s, such as about 20 seconds.

Once the process conditions have stabilized in the etching stabilization step, the controller 227 will perform an ignition step and ignite the etchants into a plasma by setting the RF power at 60 MHz to between about 100 and about 1000, such as about 200 and setting the RF power at 2 MHz to between about 100 and about 1000, such as about 200. The ignition step may be maintained for a time of between about 1 s and about 100 s, such as about 2 seconds in order to ensure ignition of the plasma.

Once ignition has occurred, a first etching step may be utilized to etch the second passivation layer 119 and the capping layer 118. The first etching step may be initiated by the controller 227 setting the RF power at 60 MHz to between about 200 and about 2000, such as about 1500 and also setting the RF power at 2 MHz to between about 200 and about 2000, such as about 1500. The first etching step will proceed with etching the second passivation layer 119 and/or the capping layer 118 for a time of between about 5 s and about 100 s, such as about 45 seconds.

A second etching step may be utilized after the first etching step. In an embodiment the second etching step may be performed by the controller 227 ending the flow rate of $CHF_3$ into the etching chamber 204, while increasing the flow rate of $CF_4$ to a rate of between about 20 sccm and about 1000 sccm, such as about 500 sccm. Additionally, the $O_2$ may be set to a flow rate of between about 20 sccm and about 1000 sccm, such as about 75 sccm, and the RF power at 2 MHz may be set to between about 200 and about 2000, such as about 1800. Additionally, the controller 227 may set the ESC HV to about 950 and maintain these conditions for a time period of between about 5 s and about 100 s, such as about 86 seconds.

Once the main etching process has been completed, an overetch process may be performed in order to ensure that all of the dielectric material from the second passivation layer 119 has been removed. In an embodiment the overetch process may initially comprise an overetch ramping step in which the RF power at 60 MHz is reduced to between about 20 and about 1000, such as about 500, while the RF power at 2 MHz is reduced to between about 200 and about 2000, such as about 500. Additionally, the flow rate of the carrier gas is reduced to between about 20 sccm and about 800 sccm, such as about 150 sccm, the B.P. is set to between about 5 Torr and about 100 Torr, such as about 20 Torr, and the ESC HV is set to between about 500 and about 5000, such as about 700. This overetch ramping step may be maintained for a time of between about 1 s and about 100 s, such as about 3 seconds.

Once the overetch ramping step has been completed, the overetch may be performed at the same conditions. The overetch may be performed at a time sufficient to ensure that the material of the second passivation layer 119 has been removed. As such, the overetch may be performed for a time of between about 1 s and about 100 s, such as about 60 seconds.

After the main etching process has transferred the pattern of the first photoresist 125 to the second passivation layer 119, a liner removal (LRM) step may be performed in order to remove the capping layer 118 once the capping layer 118 has been exposed by the main etching process. In an embodiment the LRM process may initially comprise a LRM ramping step in which the RF power at 60 MHz is reduced to between about 200 and about 2000, such as about 300 while the RF power at 2 MHz is reduced to between about 20 and about 1000, such as about 100, and the gas ratio may be set to between 5 and about 95, such as about 75. Additionally, the flow rate of the carrier gas is increased to between about 20 and about 1000, such as about 200 sccm while the flow rate of $CF_4$ is reduced to between about 20 sccm and about 1000 sccm, such as about 200 sccm, the B.P. is set to between about 5 Torr and about 100 Torr, such as about 10 Torr, and the ESC HV is set to between about 500 and about 5000, such as about 2000. This LRM ramping step may be maintained for a time of between about 1 s and about 100 s, such as about 3 seconds.

Once the LRM ramping step has been completed, the LRM may be performed at the same conditions except for the pressure, which may be increased to between about 20 mT and about 1000 mT, such as about 150 mT. The LRM may be performed at a time sufficient to ensure that the capping layer 118 has been removed and will expose the underlying first conductive connection 117. As such, the LRM may be performed for a time of between about 1 s and about 100 s, such as about 60 seconds.

After the LRM has been performed, a dechucking operation may be performed in order to prepare the semiconductor device 100 for a removal of the first photoresist 125. In an embodiment the dechucking operation may start with a dechucking ramping operation in which the pressure within the etching chamber 204 is reduced to be between about 20 mT and about 1000 mT, such as about 75 mT, the ESC HV is reduced to between about 500 and about 5000, such as about 3000, and the gas ratio may be set to between 5 and about 95, such as about 50. Additionally, the RF power at 60 MHz is reduced to between about 200 and about 2000, such as about 500, while the RF power at 2 MHz is reduced to less than 100, such as 0, and the gas flow of the carrier gas is increased to between about 20 sccm and about 1000 sccm, such as about 520 sccm. The dechucking ramping stage may be continued for between about 1 s and about 100 s, such as about 2 seconds.

Once the dechucking ramping operation has been completed, a first dechucking step reduces the ESC HV to be about 0. In an embodiment the first dechucking step may be continued for a time of between about 1 s and about 100 s, such as about 20 seconds. A second dechucking operation may be performed to reduce the RF power. In an embodiment the second dechucking operation may reduce the RF power at 60 MHz to about 0, and may be performed for a time of between about 1 s and about 100 s, such as about 10 seconds.

Additionally, while a specific embodiment of the etching process has been described above with respect to FIGS. 2-3A, these discussions are intended to be illustrative only and are not intended to be limiting upon the embodiments. Rather, any suitable combination of etchants, carrier gases, and process conditions may be utilized. All such combinations are fully intended to be included within the scope of the embodiments.

However, while the etching process 301 described above transfers the pattern of the overlying first photoresist 125 to both the second passivation layer 119 and the capping layer 118, by-products (represented in FIG. 3A by the triangles labeled 303) of the etching reactions accumulate along the sidewalls of the second passivation layer 119 and the capping layer 118. Such by-products 303 may include hardened polymers as well as C—F byproducts and the presence of these by-products 303 is considered a defect and will easily bring reliability losses if the by-products 303 are not removed from the sidewalls of the first opening 302. However, some removal processes, such as wet etches, may induce further damage to the materials of the second passivation layers 119.

Figure 3B:
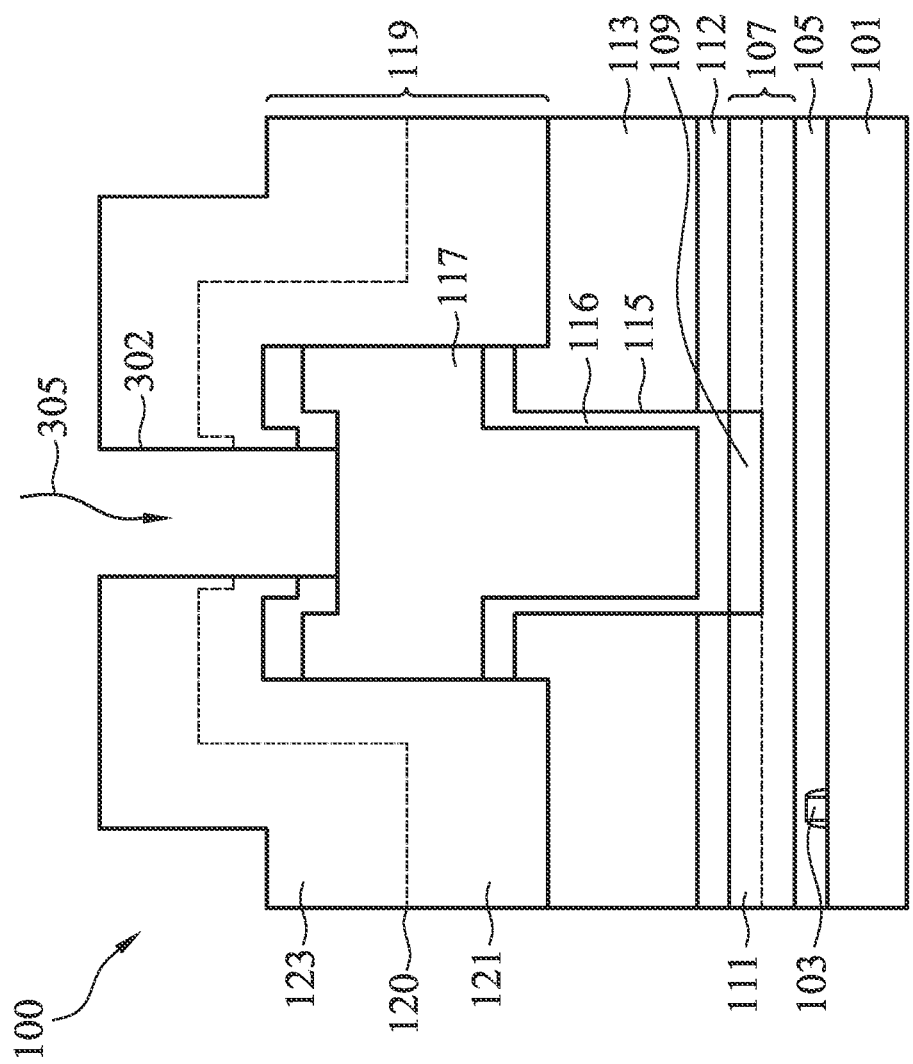

Given these issues, FIG. 3B illustrates that while the semiconductor device 100 remains within the same etching chamber 204, the first photoresist 215 as well as the by-products 303 may be removed using an ashing process (represented in FIG. 3B by the wavy arrow labeled 305). In an embodiment the ashing process 305 may be performed at a pressure of between about 2 and about 500 mT, such as about 25 mT, a source power of between about 100 W and about 1500 W, such as about 800 W, a bias power of less than about 500 W, gases such as nitrogen ($N_2$), oxygen ($O_2$), and argon, and a gas flow of less than about 1000 sccm. In particular embodiments the ratio of oxygen to nitrogen and argon may be specifically controlled and, in certain embodiments, the oxygen ratio may be between 0 and 100%.

In another embodiment, the ashing process 305 may start with a pre-heating ashing step, in which the pressure of the etching chamber 204 is increased to between about 500 mT and about 10000 mT, such as about 6000 mT, while heaters within the etching chamber 204 are set to between about 50° C. and about 250° C., such as about 200° C. and the lift pin is set to down. Additionally, while the power is still set to 0, the controller 227 may reintroduce an etchant such as oxygen at a flow rate of between about 100 sccm and about 10000 sccm, such as about 9000 sccm, and the carrier gas (e.g., nitrogen) may be introduced at a flow rate of between about 50 sccm and about 1500 sccm, such as 1000 sccm. The pre-heating ashing process may be performed for a time of between about 1 s and about 100 s, such as about 25 seconds.

Once the pre-heating ashing process 305 has been performed, a stabilization ashing step may be performed in order to stabilize the etching chamber 204 for a subsequent stripping step. In an embodiment the pressure of the etching chamber 204 may be lowered to between about 50 mT and about 1500 mT, such as about 900 mT. Additionally, the etchant flow rate (e.g., oxygen) may be decreased to between about 500 sccm and about 10000 sccm, such as about 5400 sccm, while the flow rate of the carrier gas may be reduced to between about 50 sccm and about 1000 sccm such as about 600 sccm. The pre-heating ashing process may be maintained for a time sufficient to stabilize the etching chamber 204, such as between about 1 s and about 100 s, such as about 10 seconds.

Once the stabilization ashing step has been performed and the etching chamber 204 has stabilized, the stripping step may proceed in order to remove the first photoresist 125. In an embodiment the controller may initiate the stripping step by applying a power of between about 500 and about 5000, such as about 3500. The stripping step may be performed for a time sufficient to remove the first photoresist 125 and the by-products 303 from the sidewalls of the first opening 302, such as between about 1 s and about 100 s, such as about 60 seconds.

In yet another embodiment the ashing process may be performed with oxygen as the only etchant used for the ashing process. In this embodiment, an oxygen ashing stabilization step is initiated by setting the pressure of the etching chamber 204 to between about 50 mT and about 1000 mT, such as about 300 mT, setting the T/B temperature at between about 100/10 and about 500/50, such as about 120/20, and setting the gas ratio may be set to between 5 and about 95, such as about 50. Additionally, the etchant (oxygen) may be introduced at a flow rate of between about 500 sccm and about 5000 sccm, such as about 1800 sccm, without any other etchants or carrier gases. The oxygen ashing stabilization step may be continued until the etching chamber 204 has stabilized, such as between about 1 s and about 100 s, such as about 10 seconds.

After the etching chamber 204 has stabilized, a strike step may be performed. In an embodiment the strike step may be performed by the controller 227 raising the power at 60 MHz to between about 50 and about 1000, such as about 200 (while the power at 2 MHz remains turned off). The strike step may be maintained for a time of between about 1 s and about 100 s, such as about 5 seconds.

After the strike step, the main ashing step is used to remove the first photoresist 125. In an embodiment the main ashing step may be performed using the previously set conditions, but with the controller 227 reducing the pressure within the etching chamber to between about 20 mT and about 1000 mT, such as about 100 mT. The main ashing step may be continued for a time sufficient to remove the first photoresist 125, such as between about 1 s and about 100 s, such as about 15 seconds.

Once the main ashing step has removed the first photoresist 125, a purge step may be performed. In an embodiment the power at 60 MHz may be turned off and the pressure in the etching chamber 204 reduced to between about 20 mT and about 1000 mT, such as about 50 mT. Additionally, the flow of the etchant (oxygen) is turned off, and a flow of the carrier gas (e.g., argon) is set to between about 50 and about 1500, such as about 1000. The purge step may be continued for a time of between about 1 s and about 100 s, such as about 10 seconds.

By stripping the first photoresist 125 from the second passivation layer 119 and at the same time removing the by-products 303 from the sidewalls of the first opening 302, and by doing all of the etching and ashing steps within a single etching chamber 204, a 4-in-1 approach that combines four previous machines (e.g., a separate machine for each etching, ashing, wet etching, and LRM steps) into a single etching machine with a low cost of ownership (CoO) that performs an etching step, an LRM step, and an ashing step may be achieved with a fast throughput. Such an approach that uses a single machine instead of multiple machines, can eliminate the need for a wet cleaning process, and also eliminate the need to control the dry etch to ashing and ashing to wet etch Q times.

Additionally, by using the ashing process 305 as described herein, the by-products 303 may be efficiently removed, helping to prevent polymer peeling issues without negatively impacting the properties of the second passivation layer 119. Such issues may result in defective devices and reduce the overall yield of the manufacturing process. As such, by reducing the defects and peeling that may otherwise occur, a better KLA and WAT and reliability performance may be obtained without modifying the thicknesses of the second passivation layer 119 or the composition of the first conductive connection 117.

Once the first photoresist 125 has been removed, additional processing may be performed in order to help finish the semiconductor device 100. In one embodiment an under-bump metallization layer (not separately illustrated in FIG. 3B) and a first external connection such as a solder ball or copper pillar (also not separately illustrated in FIG. 3B) may be formed in physical or electrical connection with the first conductive connection 117 in order to provide external contact to the semiconductor device 100.

Figure 4:
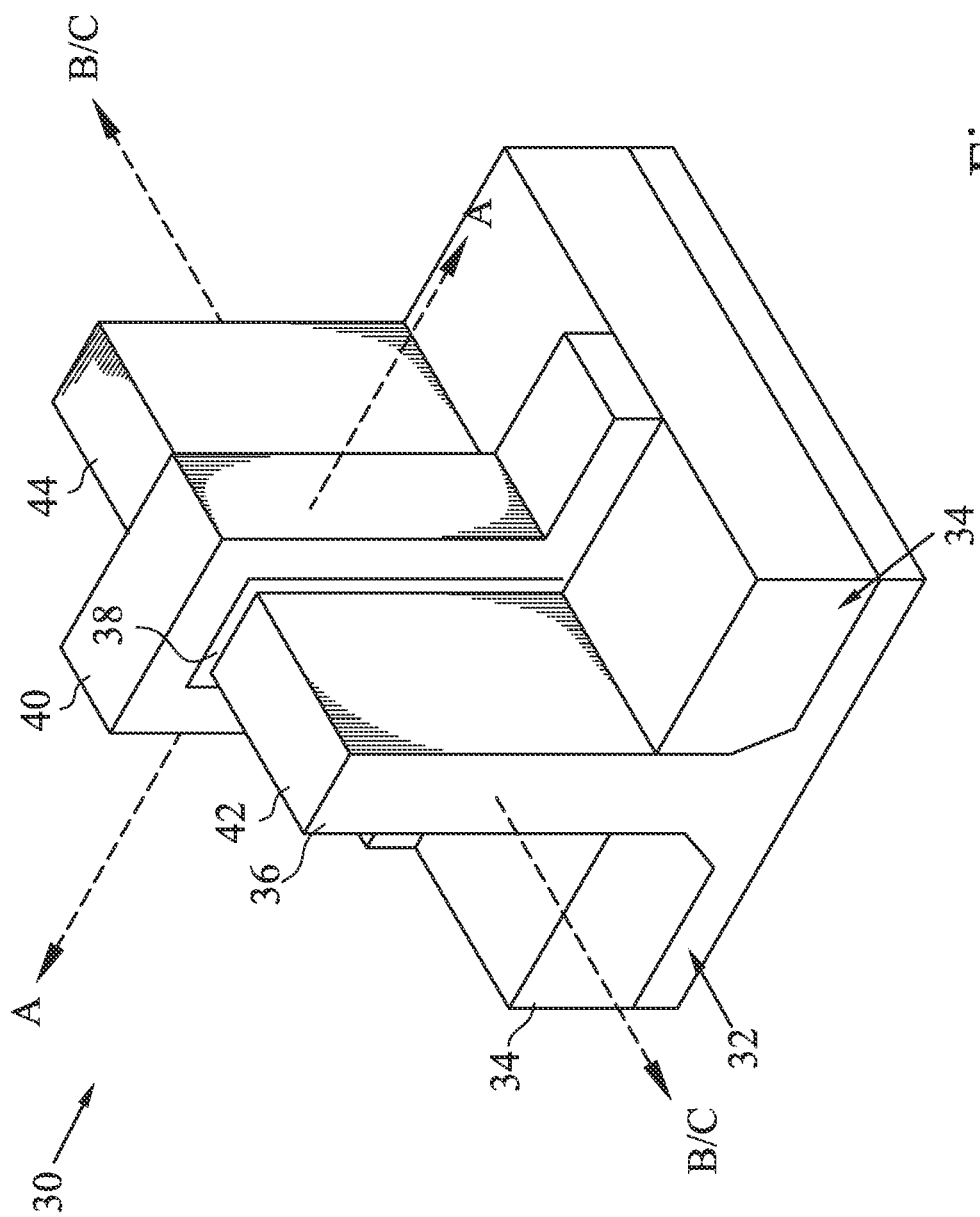
FIGS. 4-18C illustrate a FinFET process that may be utilized with the patterning of the second passivation layer in accordance with some embodiments.

FIG. 4 illustrates an example of a fin field-effect transistor (FinFET) 30 in a three-dimensional view that may be used in some embodiments. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 4 further illustrates reference cross-sections that are used in later figures. Cross-section A-A is across a channel, gate dielectric 38, and gate electrode 40 of the FinFET 30. Cross-section B/C-B/C is perpendicular to cross-section A-A and is along a longitudinal axis of the fin 36 and in a direction of, for example, a current flow between the source/drain regions 42 and 44. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 14 through 18C are cross-sectional views of intermediate stages in the manufacturing of FinFETs along with the use of the second passivation layer 119. FIGS. 14 through 18 illustrate reference cross-section A-A illustrated in FIG. 4, except for multiple FinFETs. In FIGS. 10A through 18C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 5:
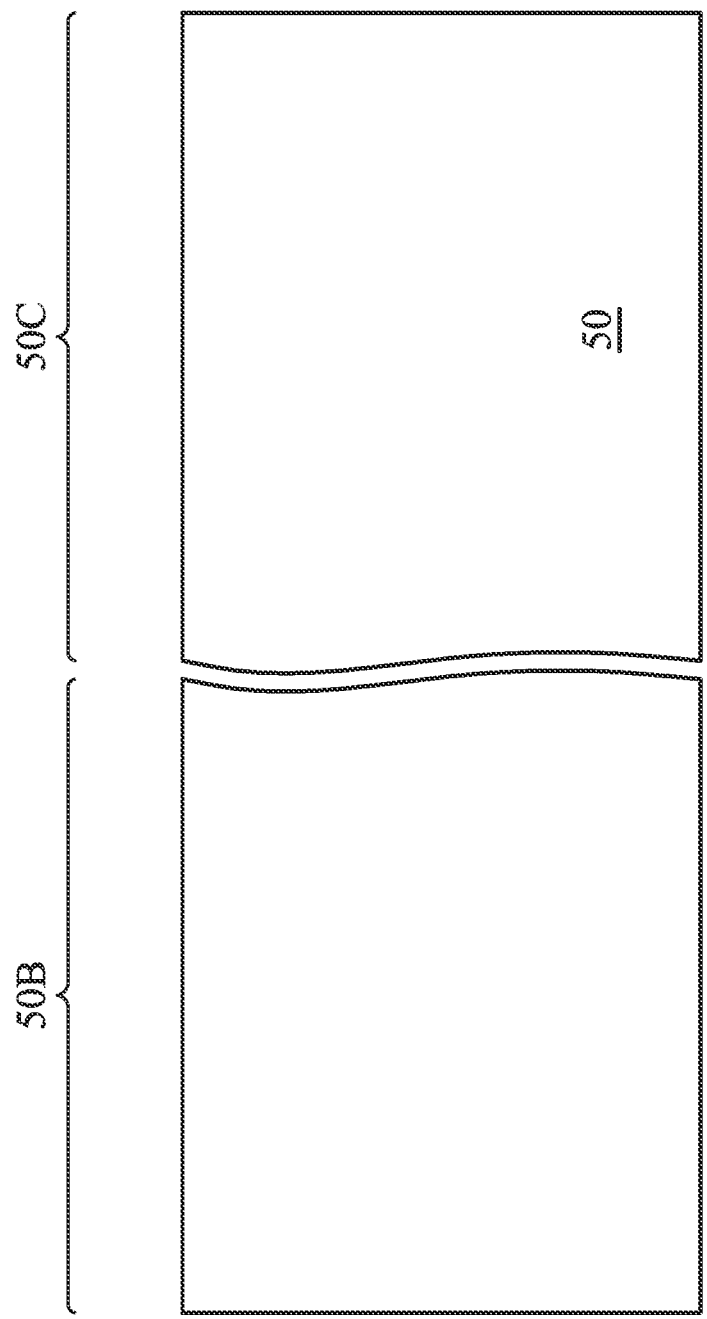

FIG. 5 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B (which corresponds to subsequent figures ending in "B") can be for forming n-type devices, such as NMOS transistors, such as n-type FinFETs. The second region 50C (which corresponds to subsequent figures ending in "C") can be for forming p-type devices, such as PMOS transistors, such as p-type FinFETs.

Figure 6:
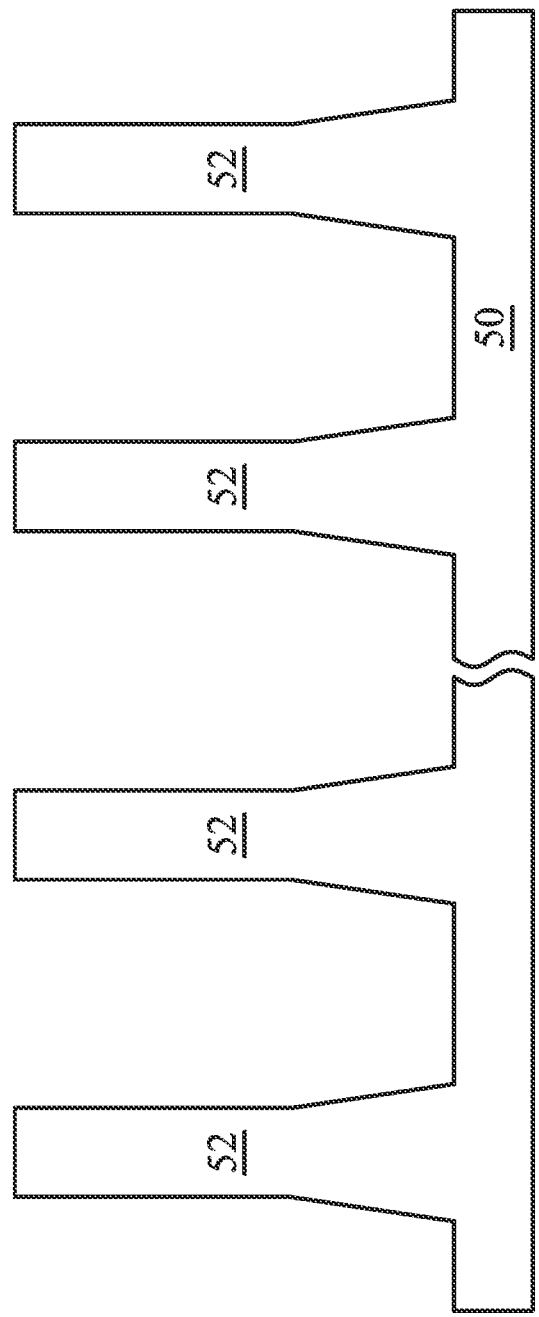
Figure 7:
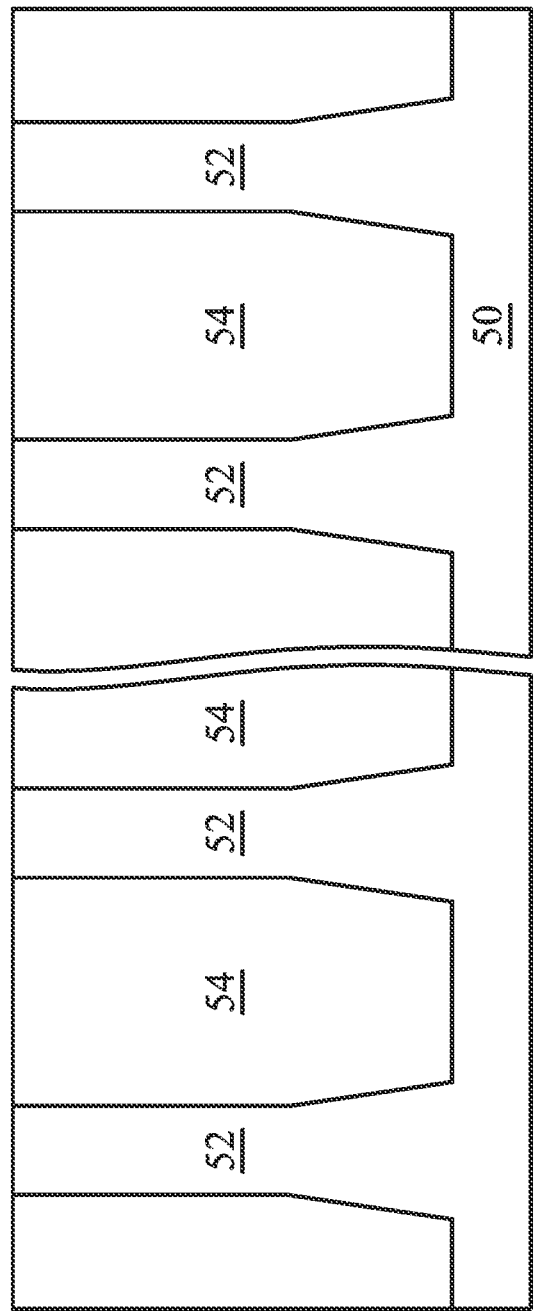

FIGS. 6 and 7 illustrate the formation of fins 52 and isolation regions 54 between neighboring fins 52. In FIG. 6 fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 7 an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. An anneal process may be performed once the insulation material is formed. In the illustrated embodiment, the insulation material 54 is silicon oxide formed by a FCVD process. The insulating material 54 may be referred to as isolation regions 54. Further in FIG. 7, a planarization process, such as a chemical mechanical polish (CMP), may remove any excess insulation material 54 and form top surfaces of the isolation regions 54 and top surfaces of the fins 52 that are coplanar.

Figure 8:
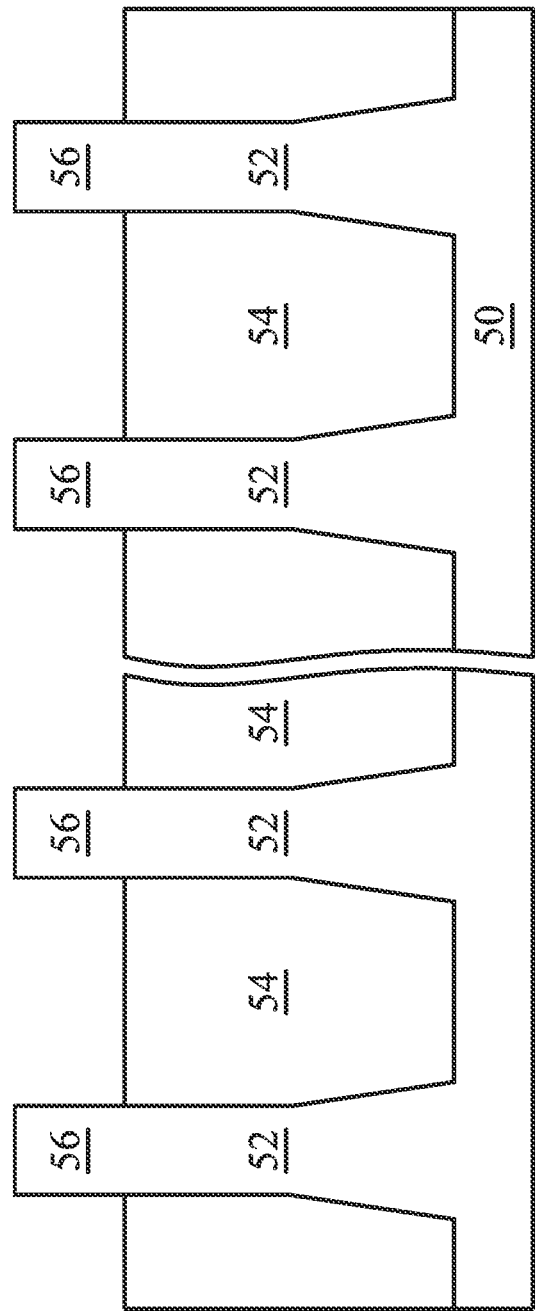

FIG. 8 illustrates the recessing of the isolation regions 54 to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 6 through 8 is just one example of how the fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 52 in FIG. 7 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In FIG. 8, appropriate wells may be formed in the fins 56, the fins 52, and/or the substrate 50. For example, a P well may be formed in the first region 50B, and an N well may be formed in the second region 50C.

The different implant steps for the different regions 50B and 50C may be achieved using a photoresist or other masks (not shown). For example, a photoresist is formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region, such as the PMOS region. The p-type impurities may be boron, BF$_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist may be removed, such as by an acceptable ashing process.

After the implants of the first region 50B and the second region 50C, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of epitaxial fins may be in situ doped during growth, which may obviate the implantations, although in situ and implantation doping may be used together.

Figure 9:
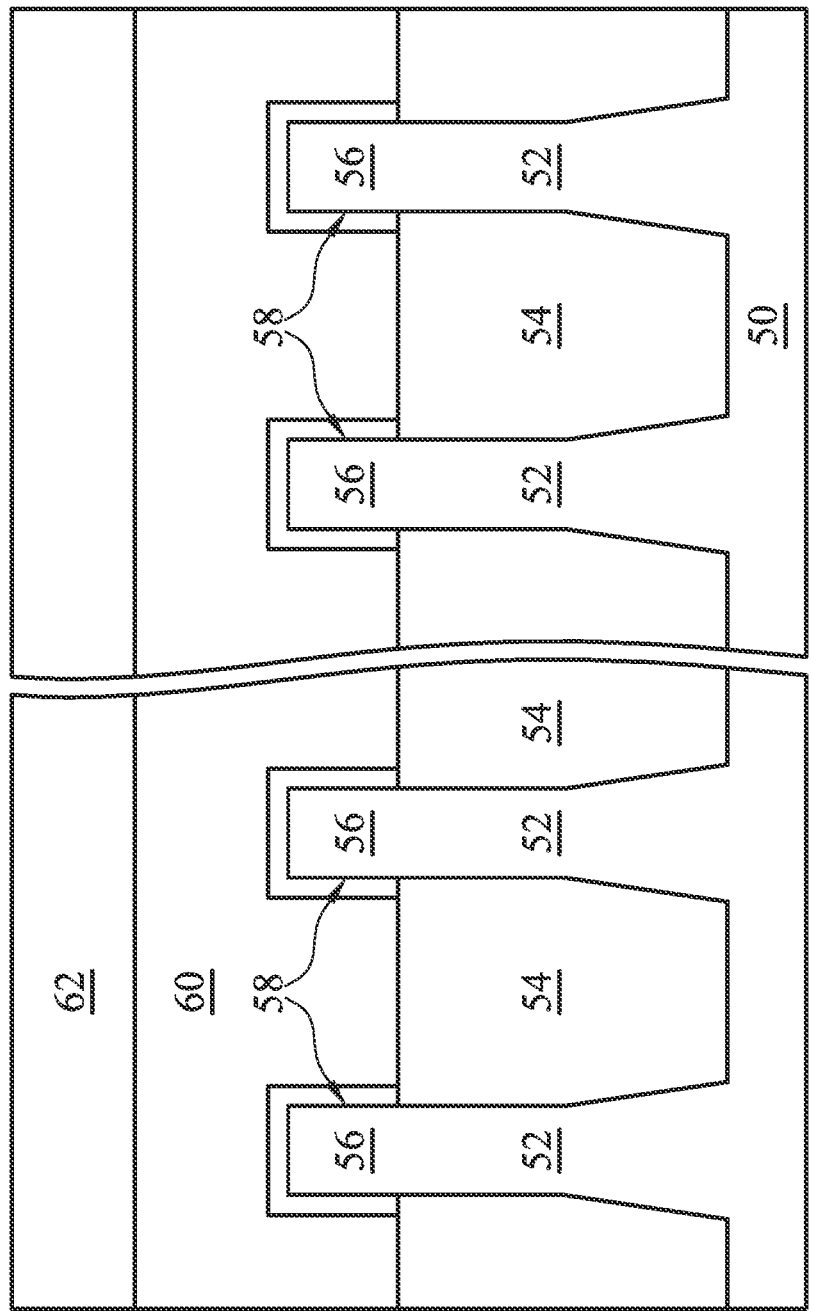

In FIG. 9, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 50B and the second region 50C. In other embodiments, separate dummy gate layers may be formed in the first region 50B and the second region 50C, and separate mask layers may be formed in the first region 50B and the second region 50C.

Figure 10A:
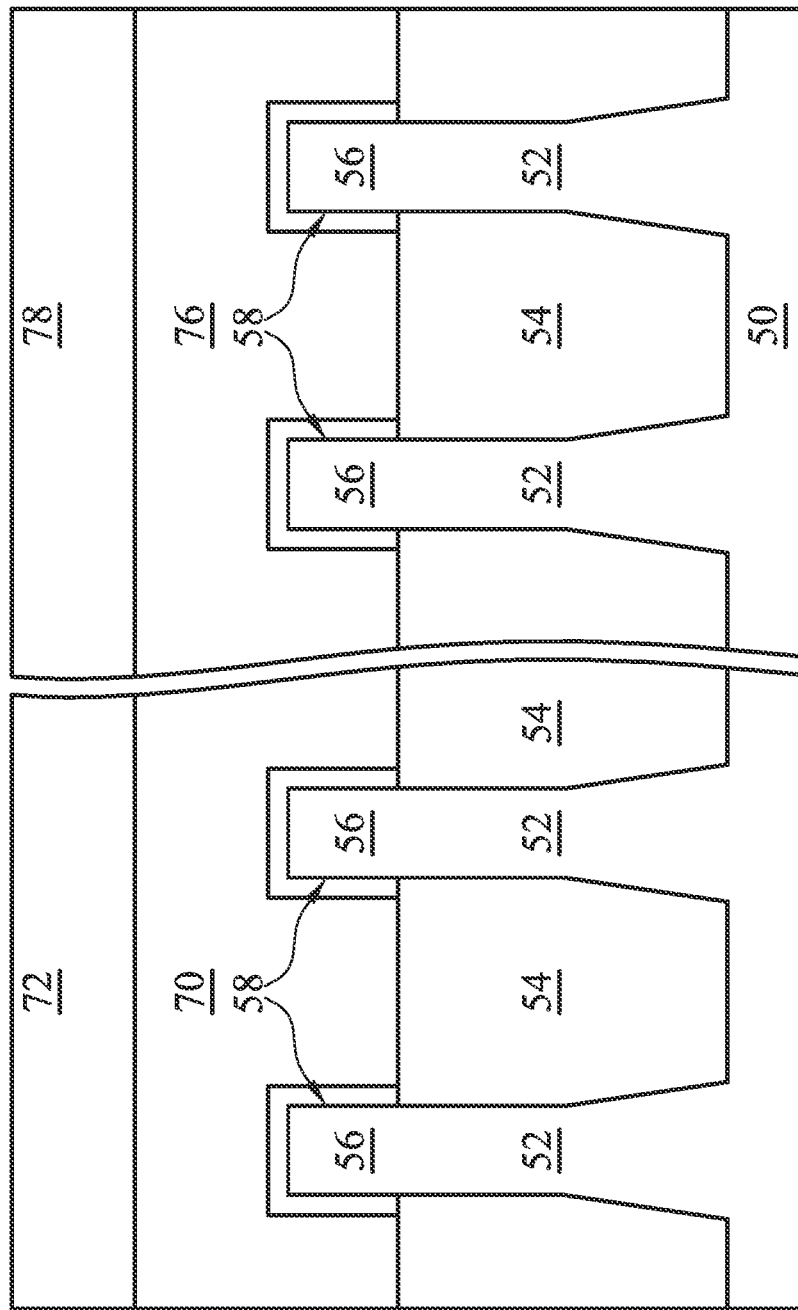
Figure 10C:
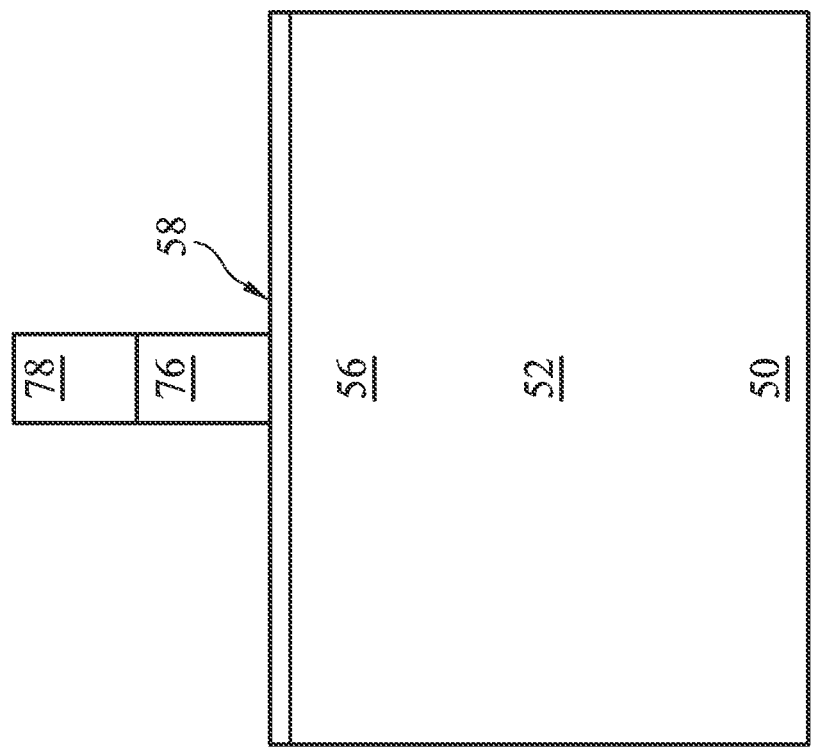
Figure 10B:
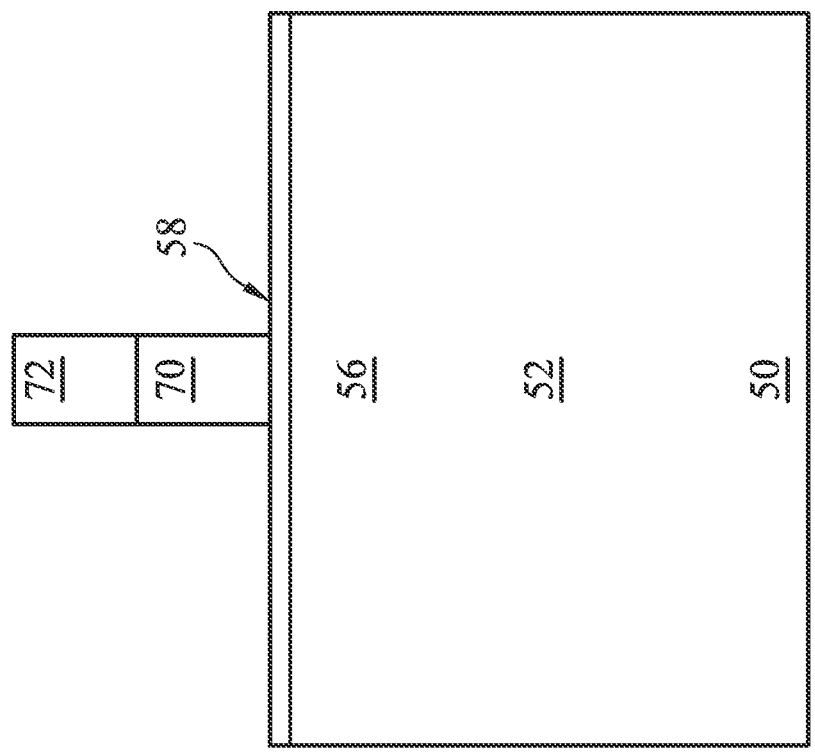

In FIGS. 10A, 10B, and 10C, the mask layer 62 may be patterned using acceptable photolithography and etching techniques to form masks 72 in the first region 50B (as illustrated in FIG. 10B) and masks 78 in the second region 50C (as illustrated in FIG. 10C). The pattern of the masks 72 and 78 then may be transferred to the dummy gate layer 60 and dummy dielectric layer 58 by an acceptable etching technique to form dummy gates 70 in the first region 50B and dummy gates 76 in the second region 50C. The dummy gates 70 and 76 cover respective channel regions of the fins 56. The dummy gates 70 and 76 may also have a lengthwise direction substantially perpendicular to the lengthwise direction of respective epitaxial fins.

Figure 11A:
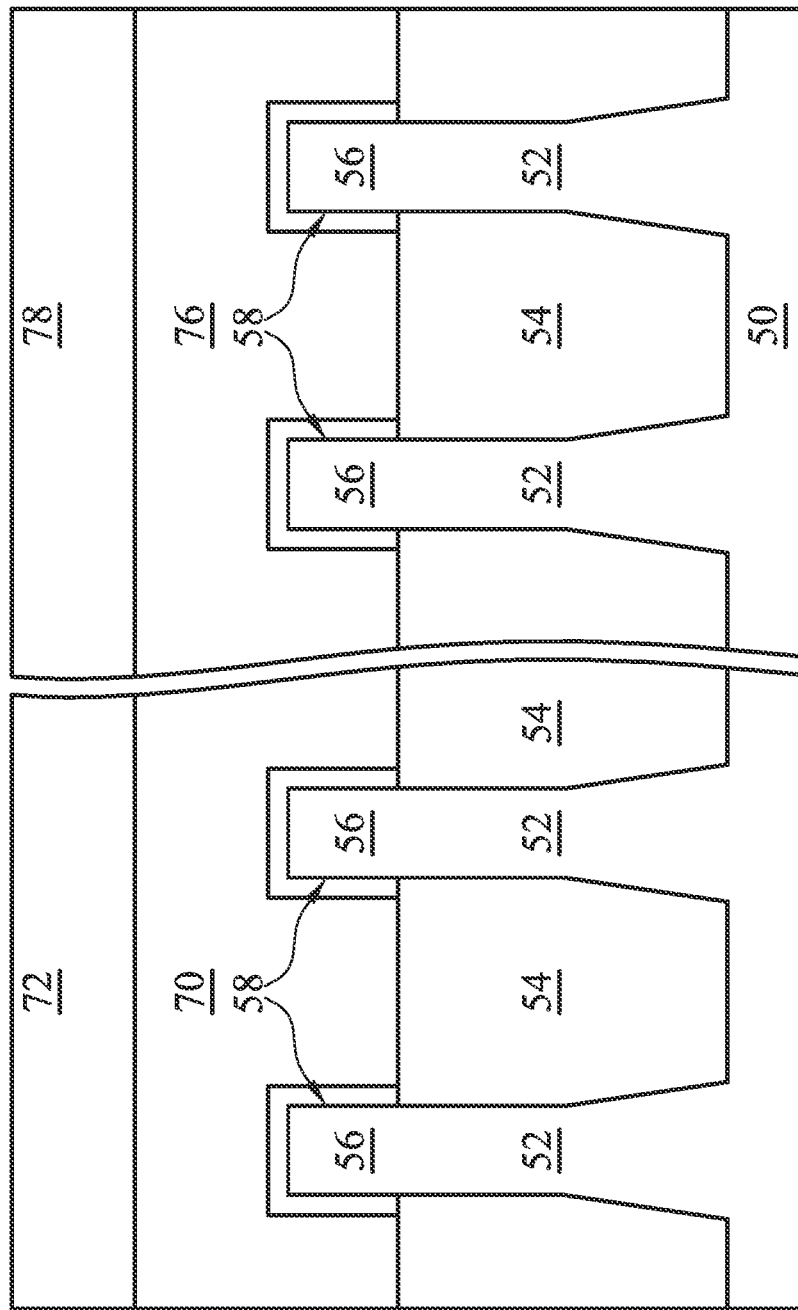
Figure 11C:
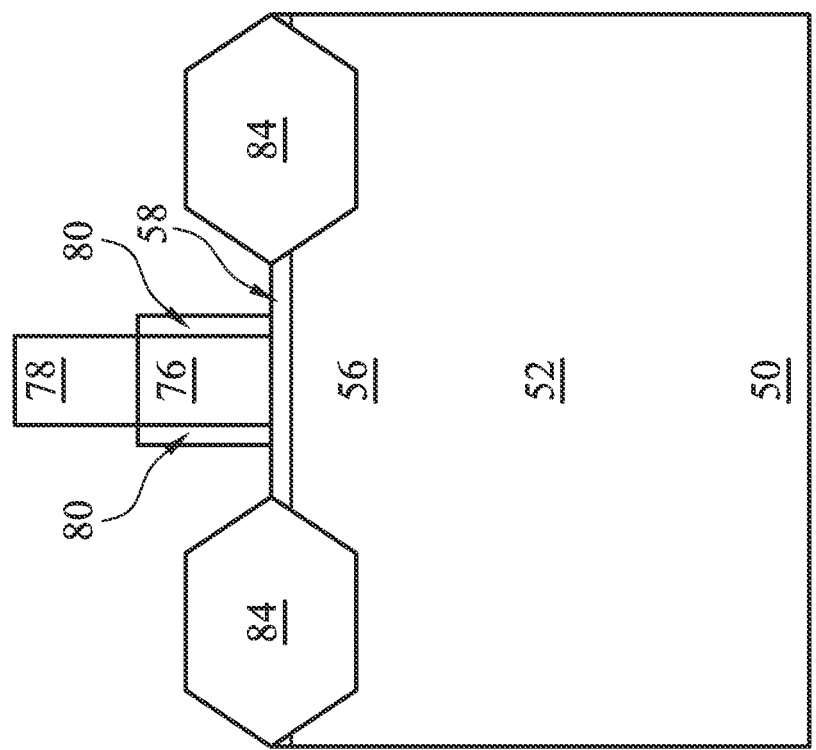
Figure 11B:
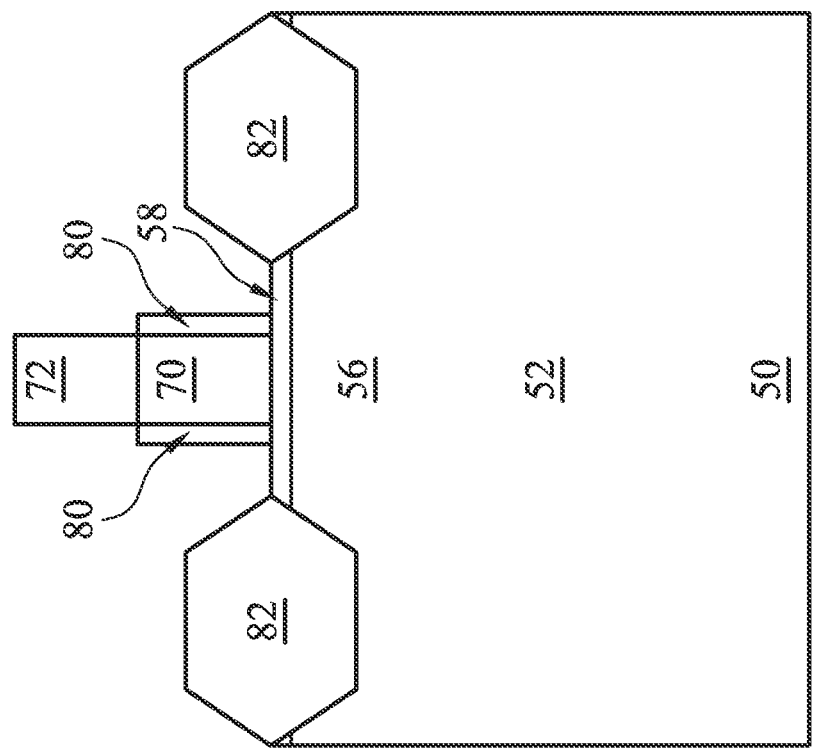

In FIGS. 11A, 11B, and 11C, gate seal spacers 80 can be formed on exposed surfaces of respective dummy gates 70 and 76 and/or fins 56. A thermal oxidation or a deposition followed by an anisotropic etch may form the gate seal spacers 80.

After the formation of the gate seal spacers 80, implants for lightly doped source/drain (LDD) regions may be performed. Similar to the implants discussed above, a mask, such as a photoresist, may be formed over the first region 50B, e.g., NMOS region, while exposing the second region 50C, e.g., PMOS region, and p-type impurities may be implanted into the exposed fins 56 in the second region 50C. The mask may then be removed. Subsequently, a mask, such as a photoresist, may be formed over the second region 50C while exposing the first region 50B, and n-type impurities may be implanted into the exposed fins 56 in the first region 50B. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 11A, 11B, and 11C, epitaxial source/drain regions 82 and 84 are formed in the fins 56. In the first region 50B, epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52. In the second region 50C, epitaxial source/drain regions 84 are formed in the fins 56 such that each dummy gate 76 is disposed between respective neighboring pairs of the epitaxial source/drain regions 84. In some embodiments that epitaxial source/drain regions 84 may extend into the fins 52.

Epitaxial source/drain regions 82 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. The epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Subsequently, the dummy gate spacers in the first region 50B are removed, for example, by an etch, as is the mask on the second region 50C.

Epitaxial source/drain regions 84 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 76 and/or gate seal spacers 80 in the second region 50C. Then, source/drain regions of the epitaxial fins in the second region 50C are etched to form recesses. The epitaxial source/drain regions 84 in the second region 50C are epitaxially grown in the recesses. The epitaxial source/drain regions 84 may include any acceptable material, such as appropriate for p-type FinFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. Subsequently, the dummy gate spacers in the second region 50C are removed, for example, by an etch, as is the mask on the first region 50B.

Figure 12A:
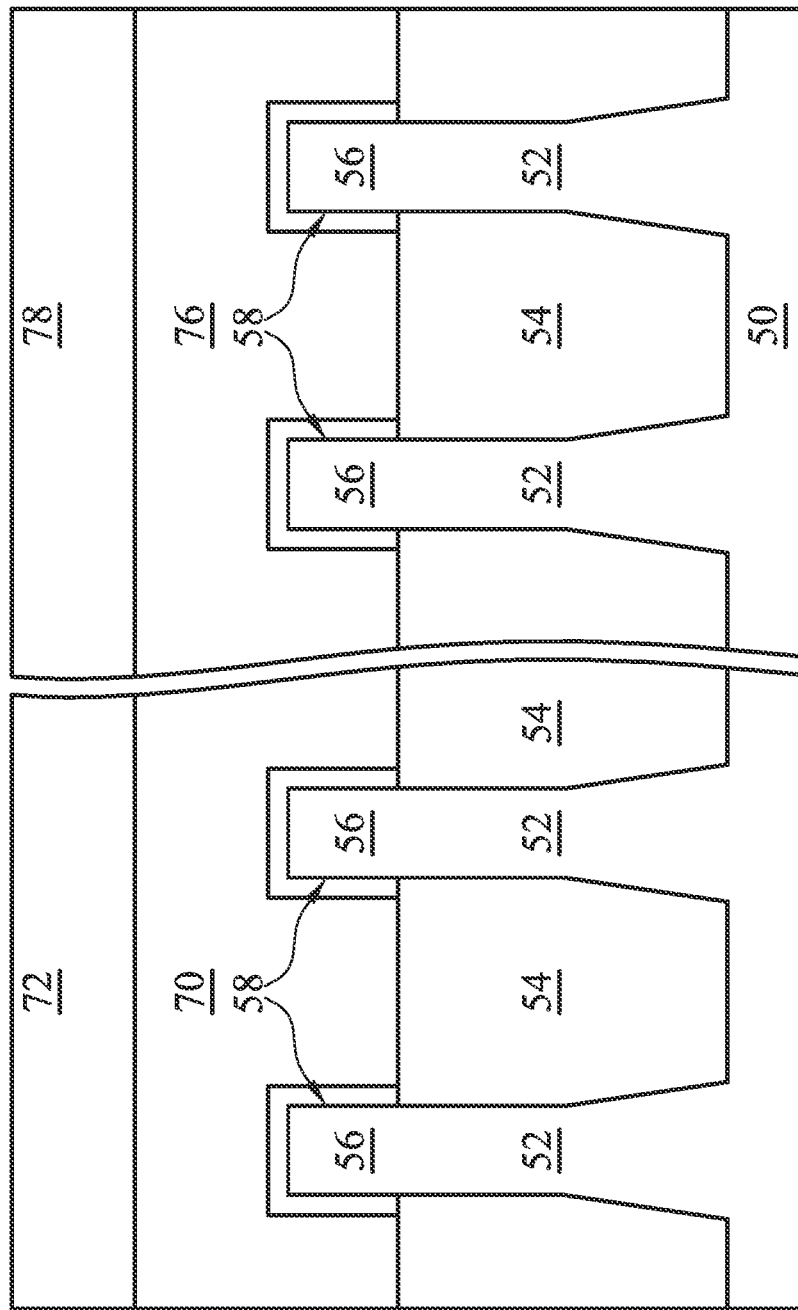
Figure 12C:
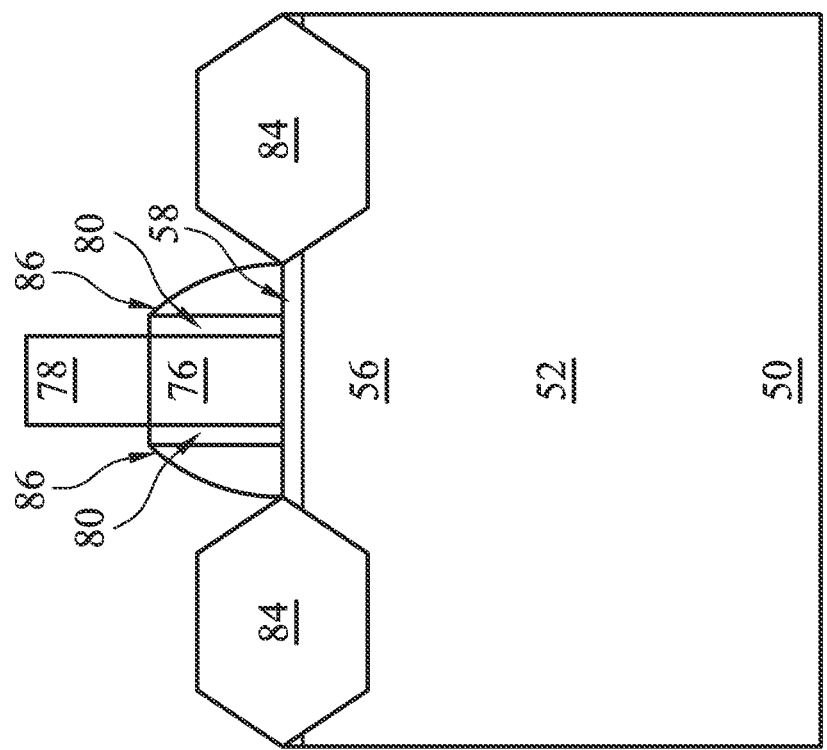
Figure 12B:
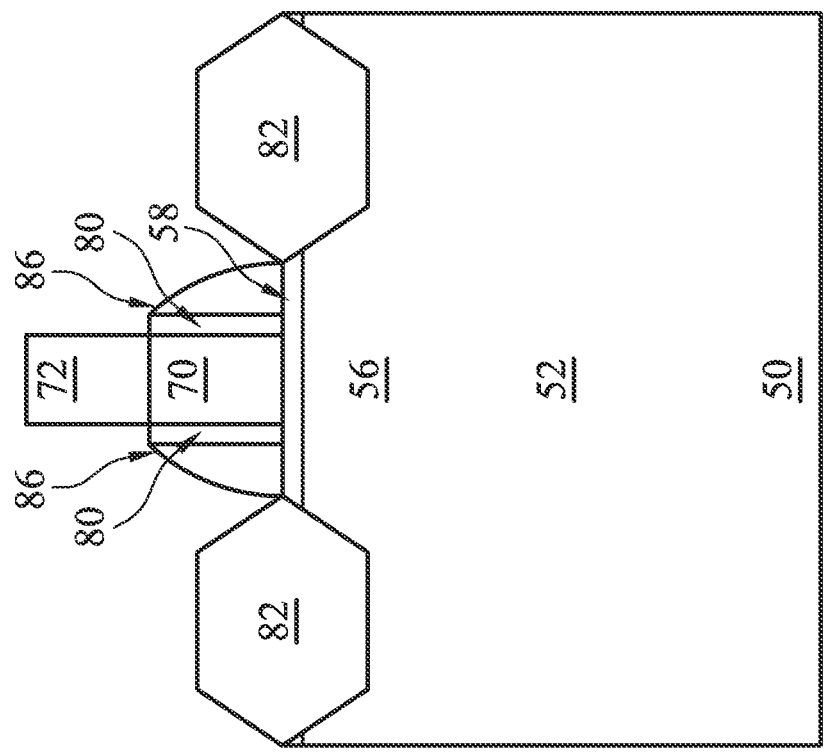

In FIGS. 12A, 12B, and 12C, gate spacers 86 are formed on the gate seal spacers 80 along sidewalls of the dummy gates 70 and 76. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and 84 and/or epitaxial fins may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The n-type impurities for source/drain regions in the first region 50B, e.g., the NMOS region, may be any of the n-type impurities previously discussed, and the p-type impurities for source/drain regions in the second region 50C, e.g., the PMOS region, may be any of the p-type impurities previously discussed. In other embodiments, the epitaxial source/drain regions 82 and 84 may be in situ doped during growth.

Figure 13A:
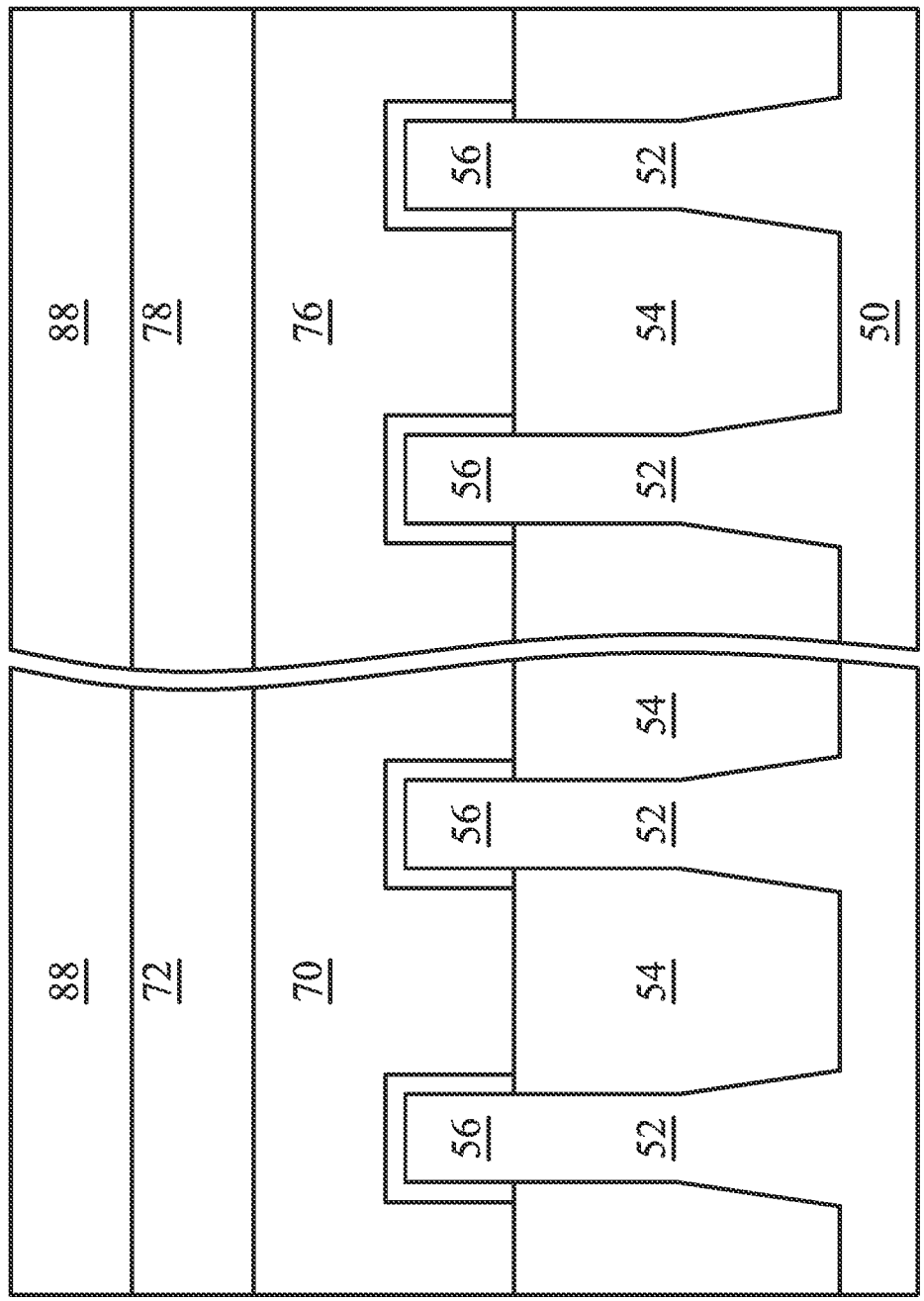
Figure 13C:
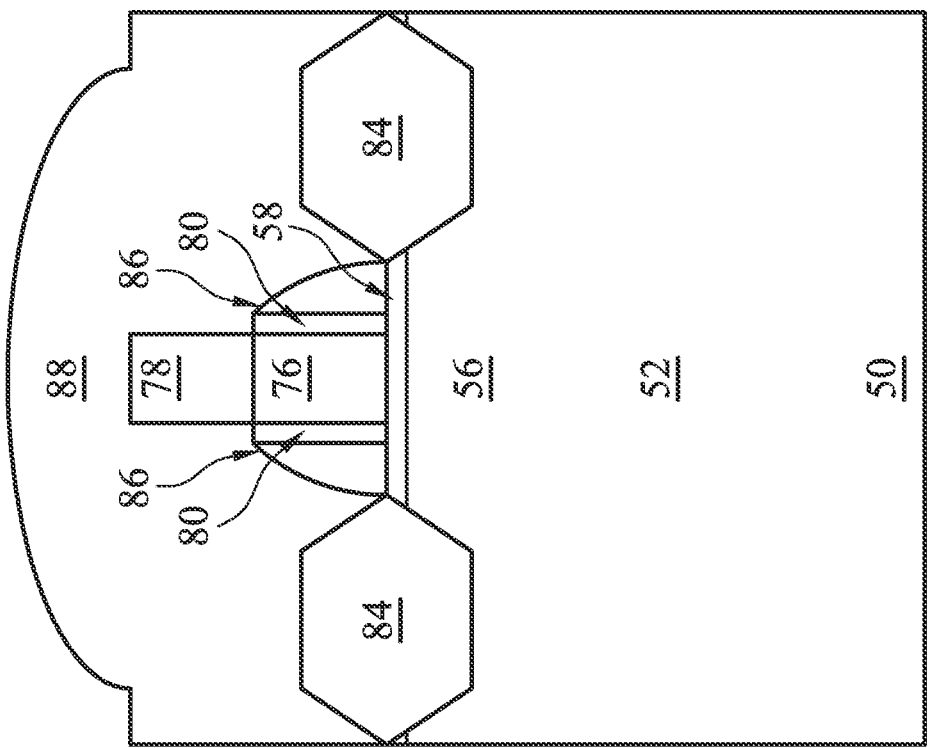
Figure 13B:
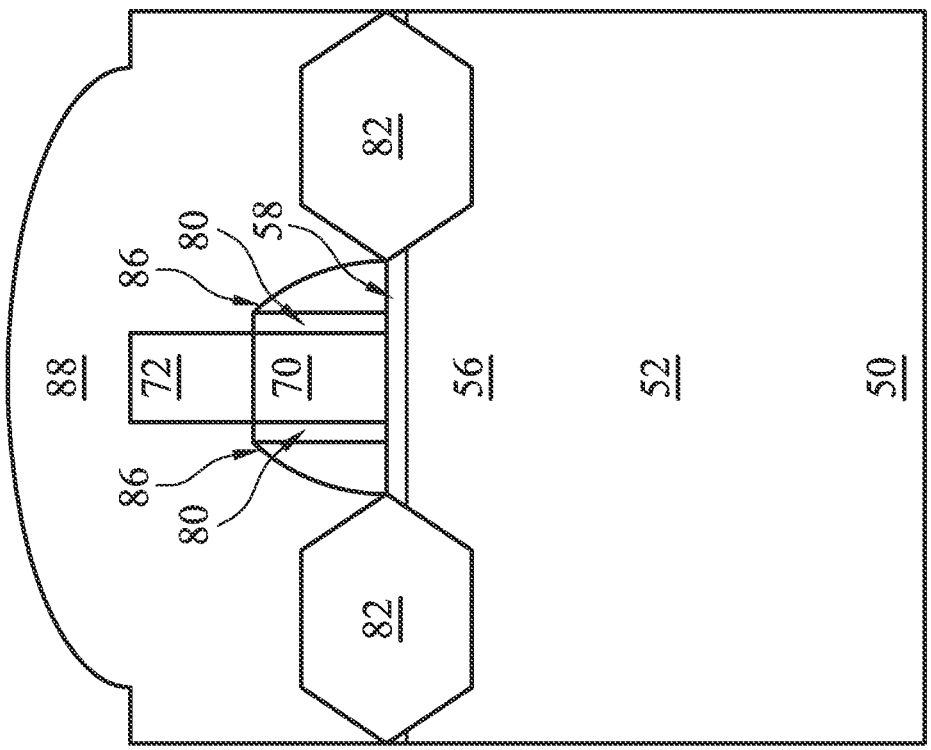

In FIGS. 13A, 13B, and 13C, an ILD 88 is deposited over the structure illustrated in FIGS. 12A, 12B, and 12C. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD.

Figure 14A:
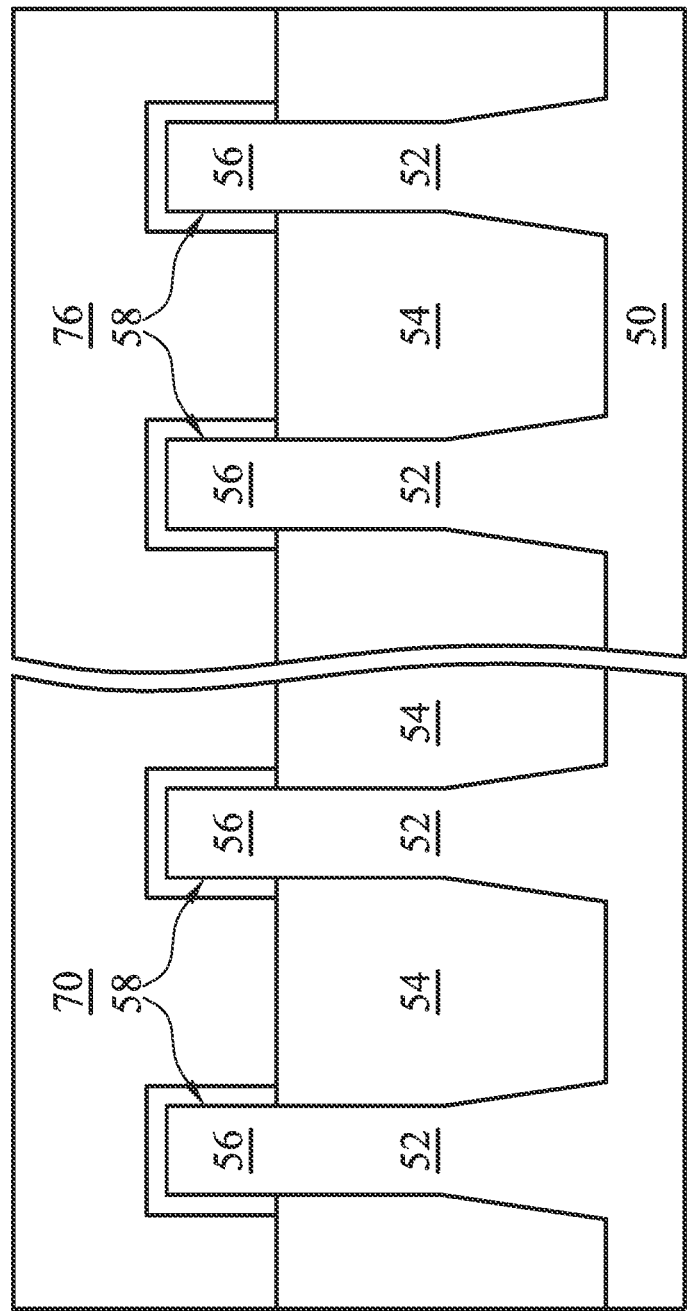
Figure 14C:
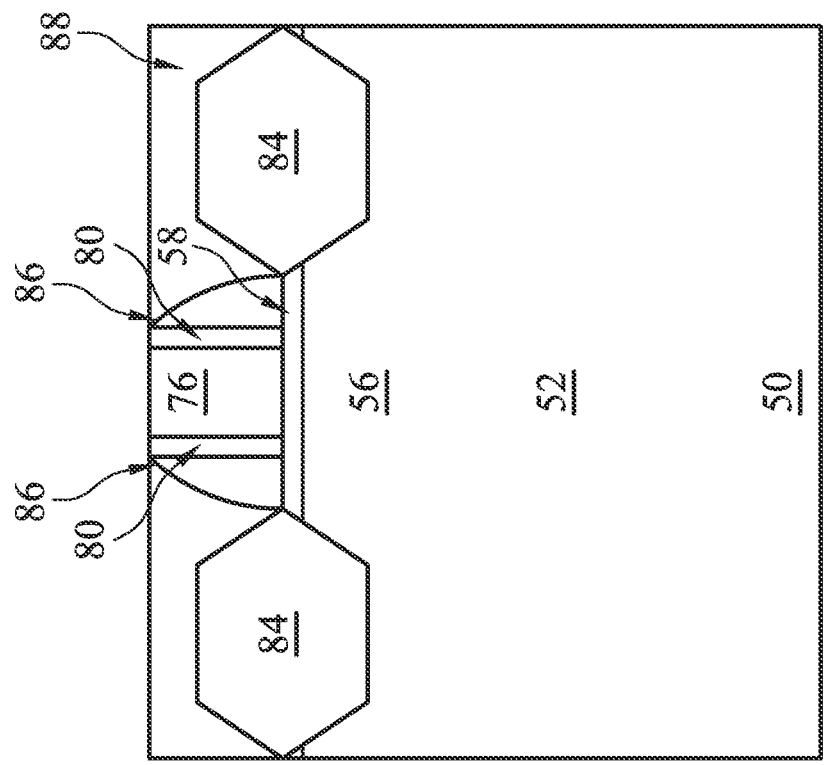
Figure 14B:
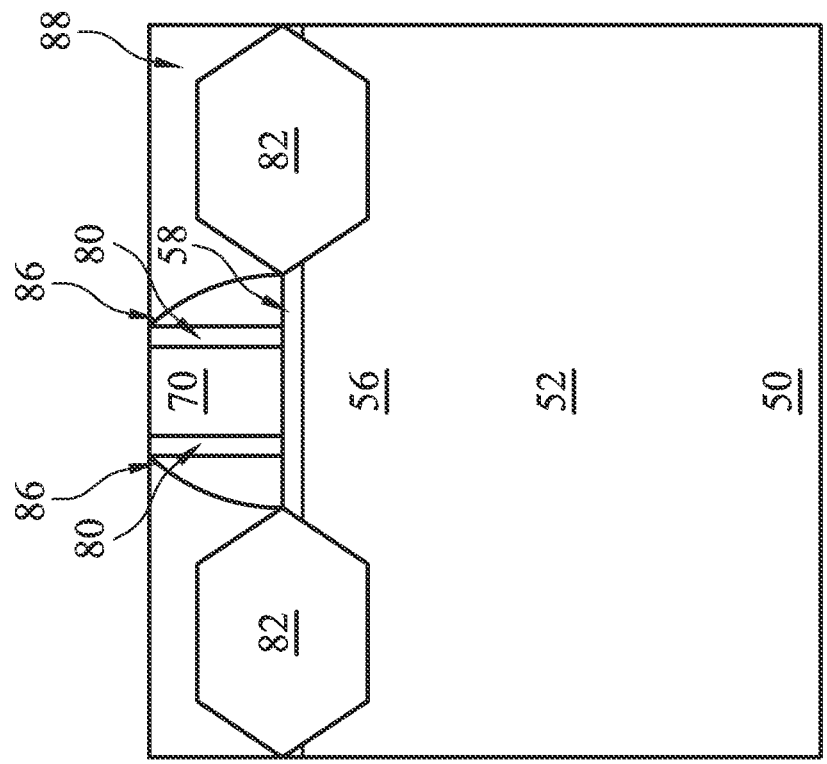

In FIGS. 14A, 14B, and 14C, a planarization process, such as a CMP, may be performed to level the top surface of the ILD 88 with the top surfaces of the dummy gates 70 and 76. The CMP may also remove the masks 72 and 78 on the dummy gates 70 and 76. Accordingly, top surfaces of the dummy gates 70 and 76 are exposed through the ILD 88.

Figure 15A:
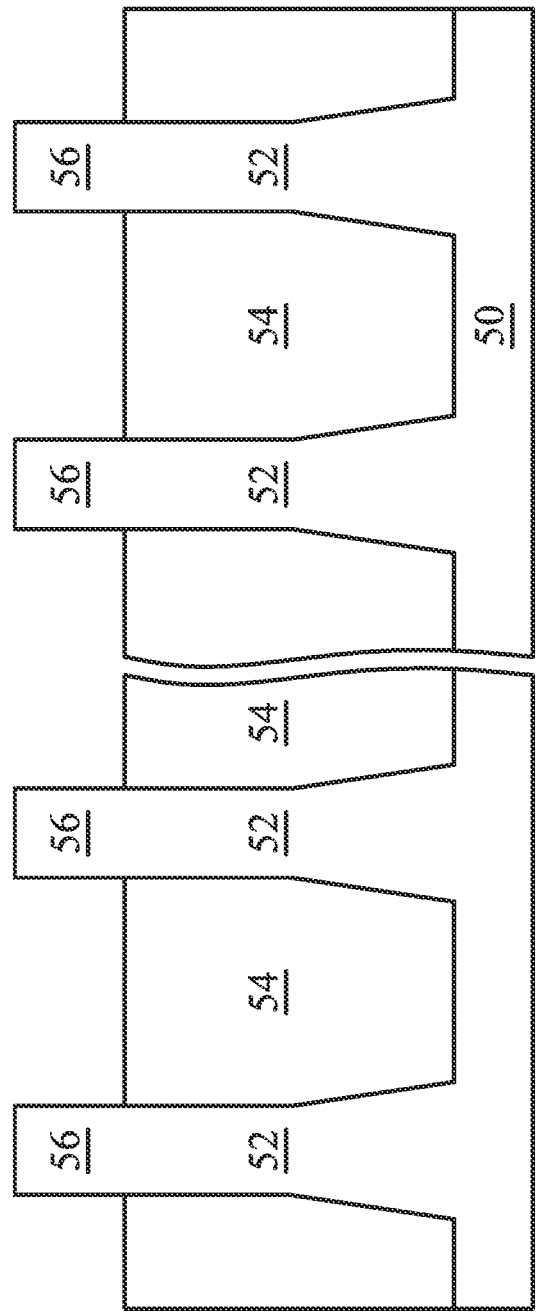
Figure 15C:
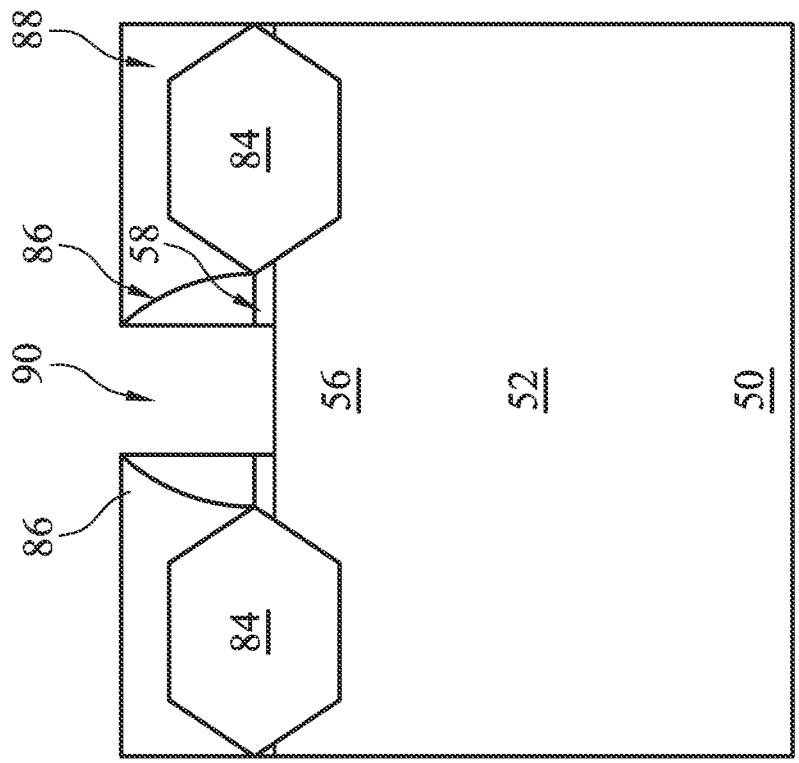
Figure 15B:
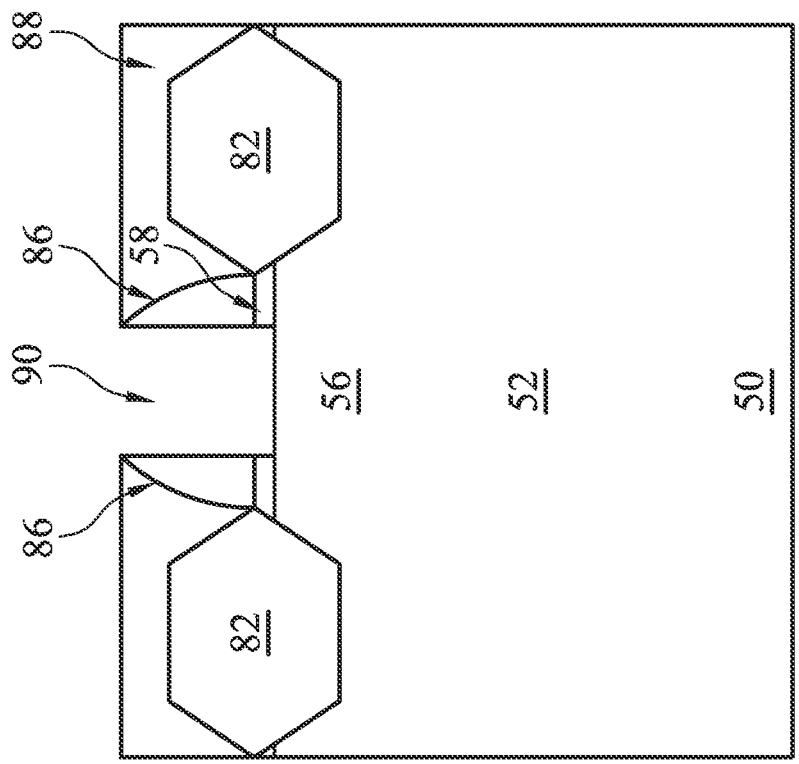

In FIGS. 15A, 15B, and 15C, the dummy gates 70 and 76, gate seal spacers 80, and portions of the dummy dielectric layer 58 directly underlying the dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. The dummy dielectric layer 58 and gate seal spacers 80 may then be removed after the removal of the dummy gates 70 and 76.

Figure 16A:
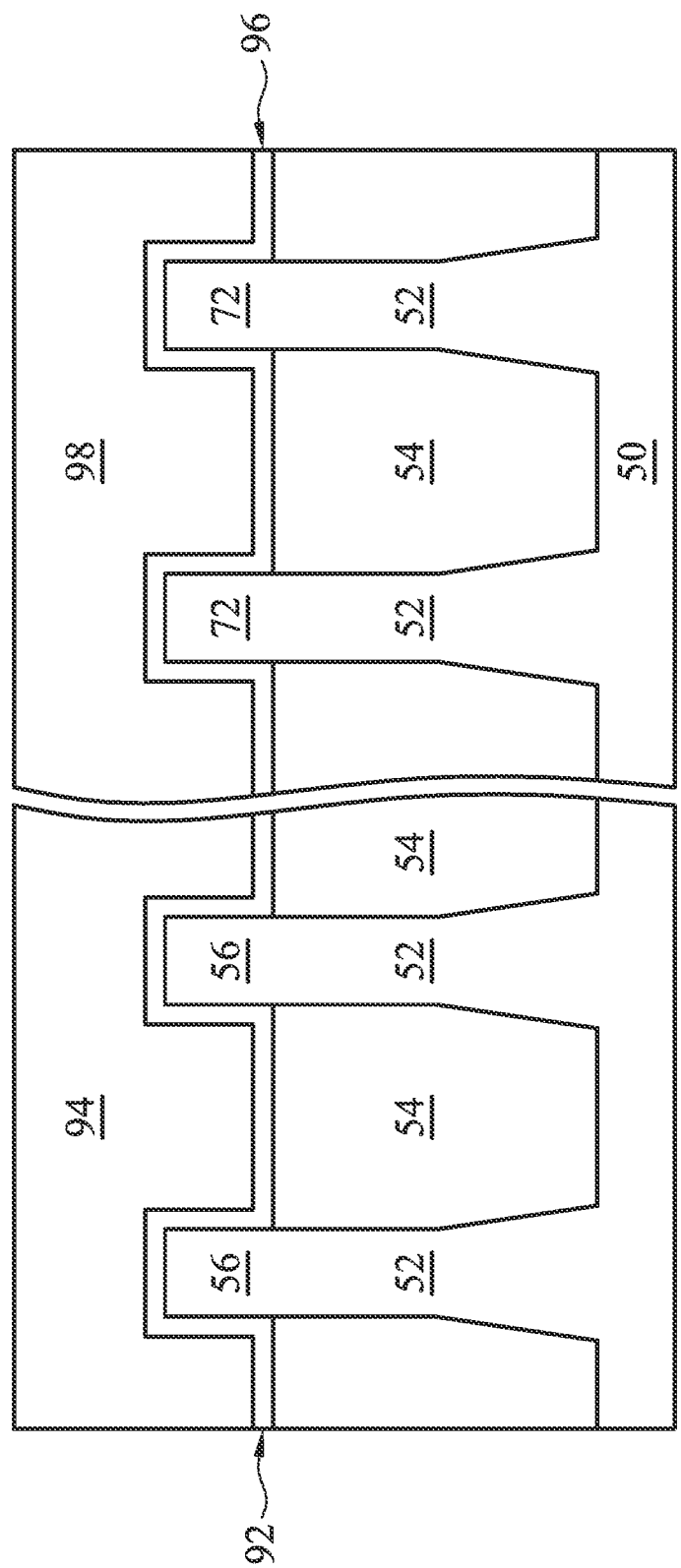
Figure 16C:
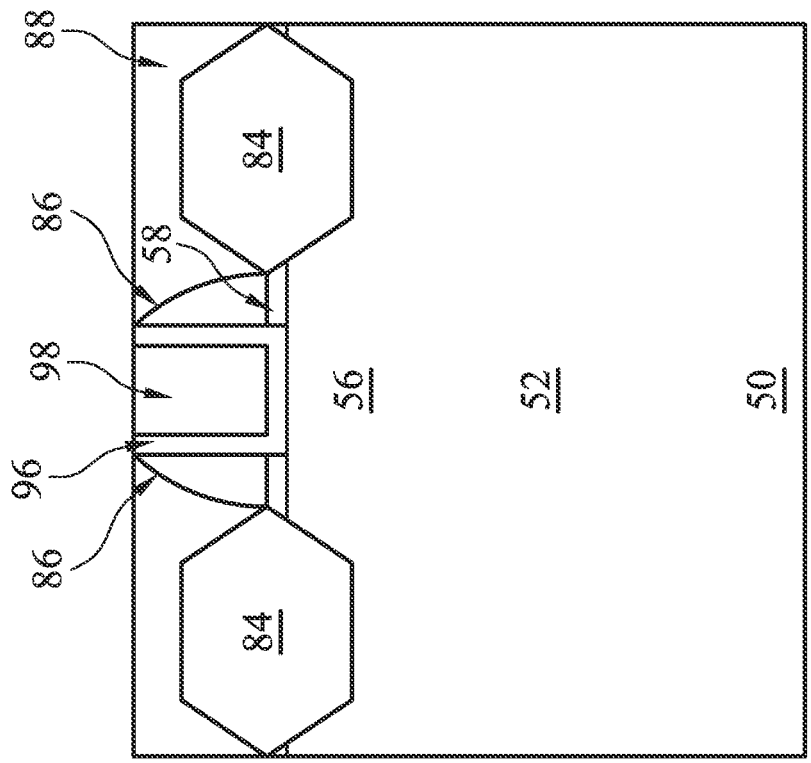
Figure 16B:
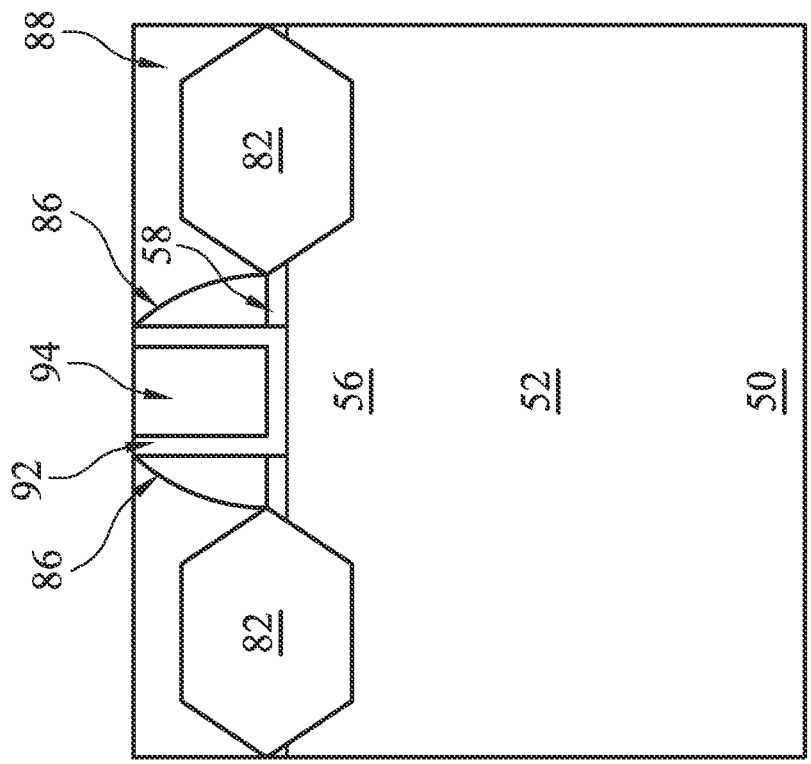

In FIGS. 16A, 16B, and 16C, gate dielectric layers 92 and 96 and gate electrodes 94 and 98 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, combinations thereof, or multi-layers thereof. After the filling of gate electrodes 94 and 98, in step 228, a planarization process, such as a CMP, may be performed to remove the excess portions of gate dielectric layers 92 and 96 and the material of gate electrodes 94 and 98, which excess portions are over the top surface of the ILD 88. The resulting remaining portions of material of gate electrodes 94 and 98 and gate dielectric layers 92 and 96 thus form replacement gates of the resulting FinFETs.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 17A:
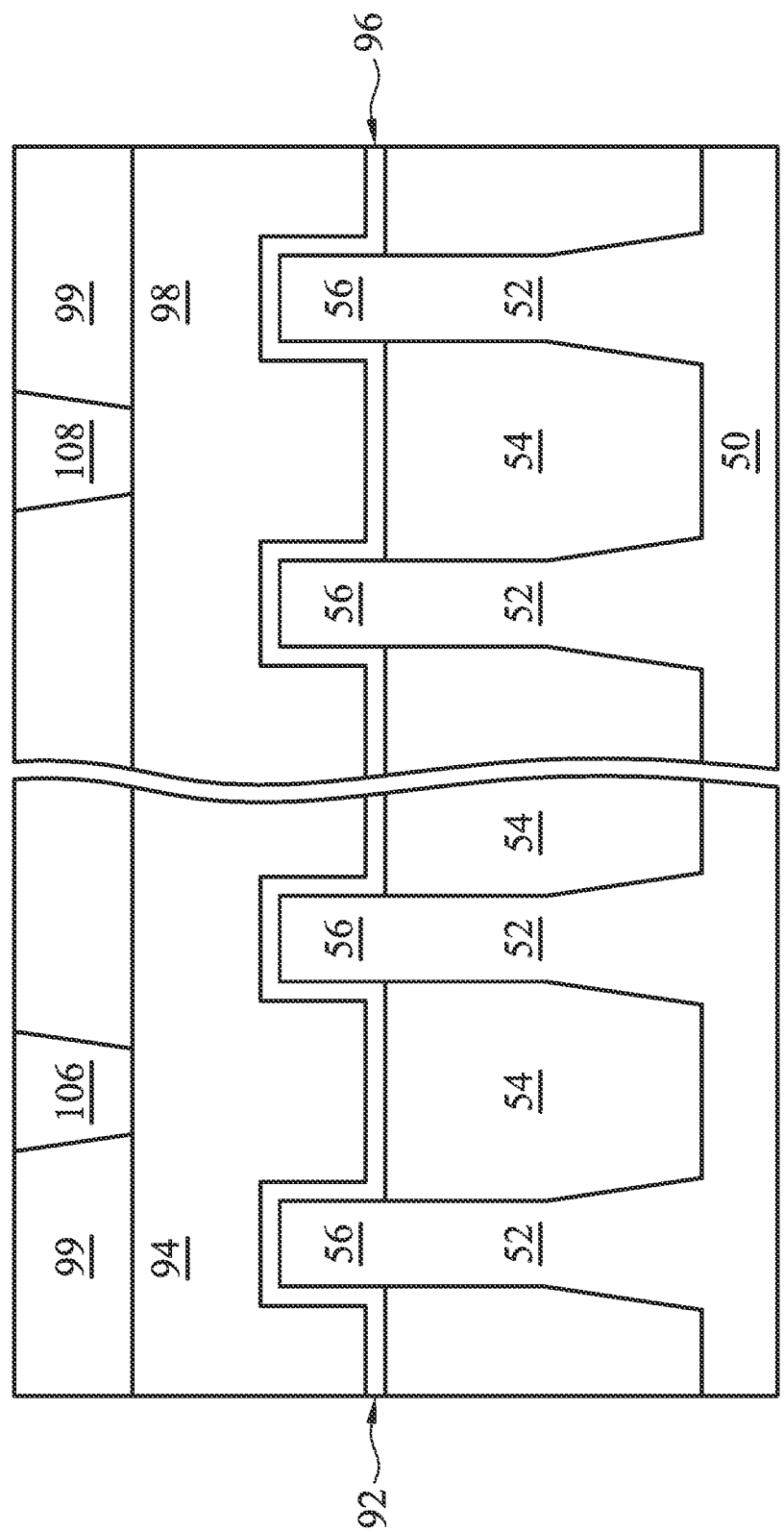
Figure 17C:
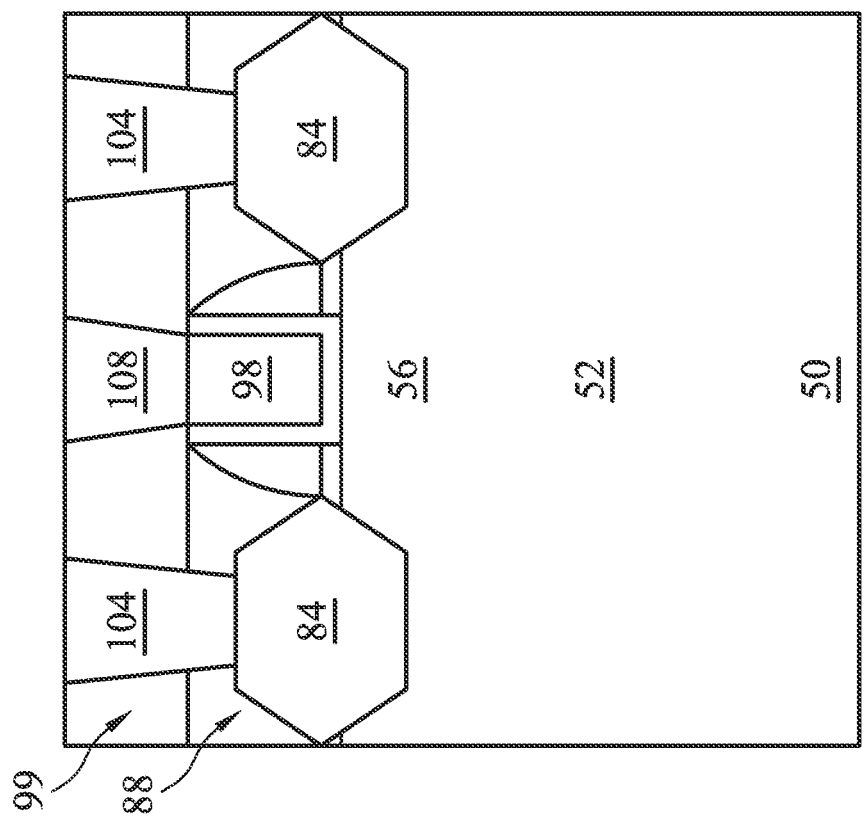
Figure 17B:
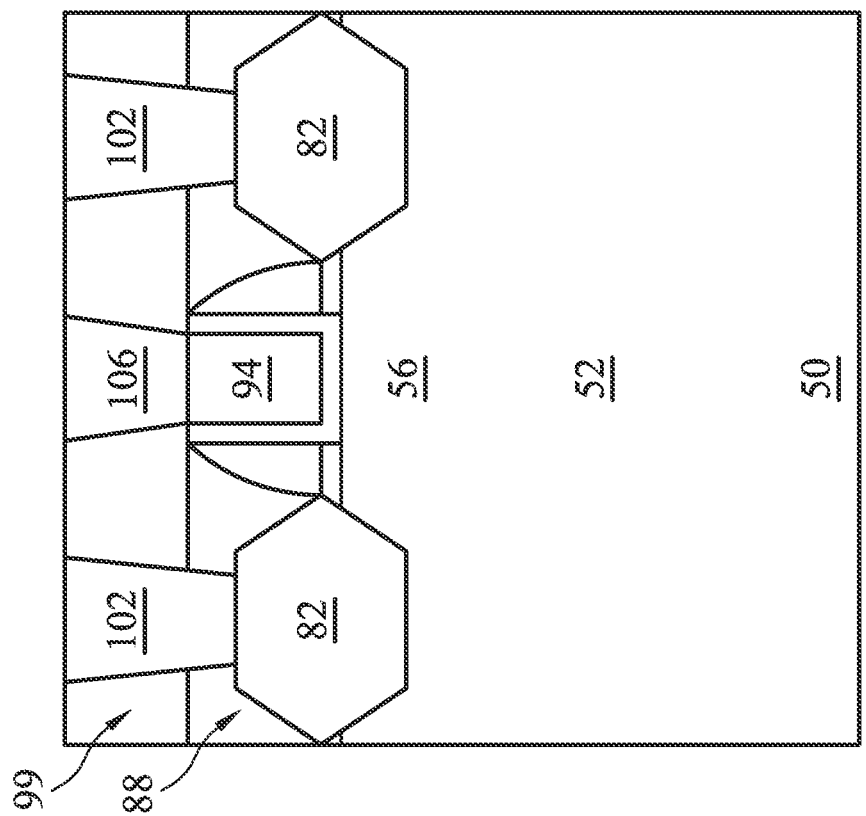

In FIGS. 17A, 17B, and 17C, an ILD 99 is deposited over the ILD 88. Further illustrated in FIGS. 17A, 17B, and 17C, contacts 102 and 104 are formed through ILD 99 and ILD 88 and contacts 106 and 108 are formed through ILD 99. In an embodiment, the ILD 99 is a flowable film formed by a flowable CVD method. In some embodiments, the ILD 99 is formed of a dielectric material such as PSG, BSG, BPSG, USG, or the like, and may be deposited by any suitable method, such as CVD and PECVD. Openings for contacts 102 and 104 are formed through the ILDs 88 and 99. Openings for contacts 106 and 108 are formed through the ILD 99. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 99. The remaining liner and conductive material form contacts 102 and 104 in the openings. An anneal process may be performed to form a silicide at the interface between the epitaxial source/drain regions 82 and 84 and the contacts 102 and 104, respectively. Contacts 102 are physically and electrically coupled to the epitaxial source/drain regions 82, contacts 104 are physically and electrically coupled to the epitaxial source/drain regions 84, contact 106 is physically and electrically coupled to the gate electrode 94, and contact 108 is physically and electrically coupled to the gate electrode 98.

Figure 18A:
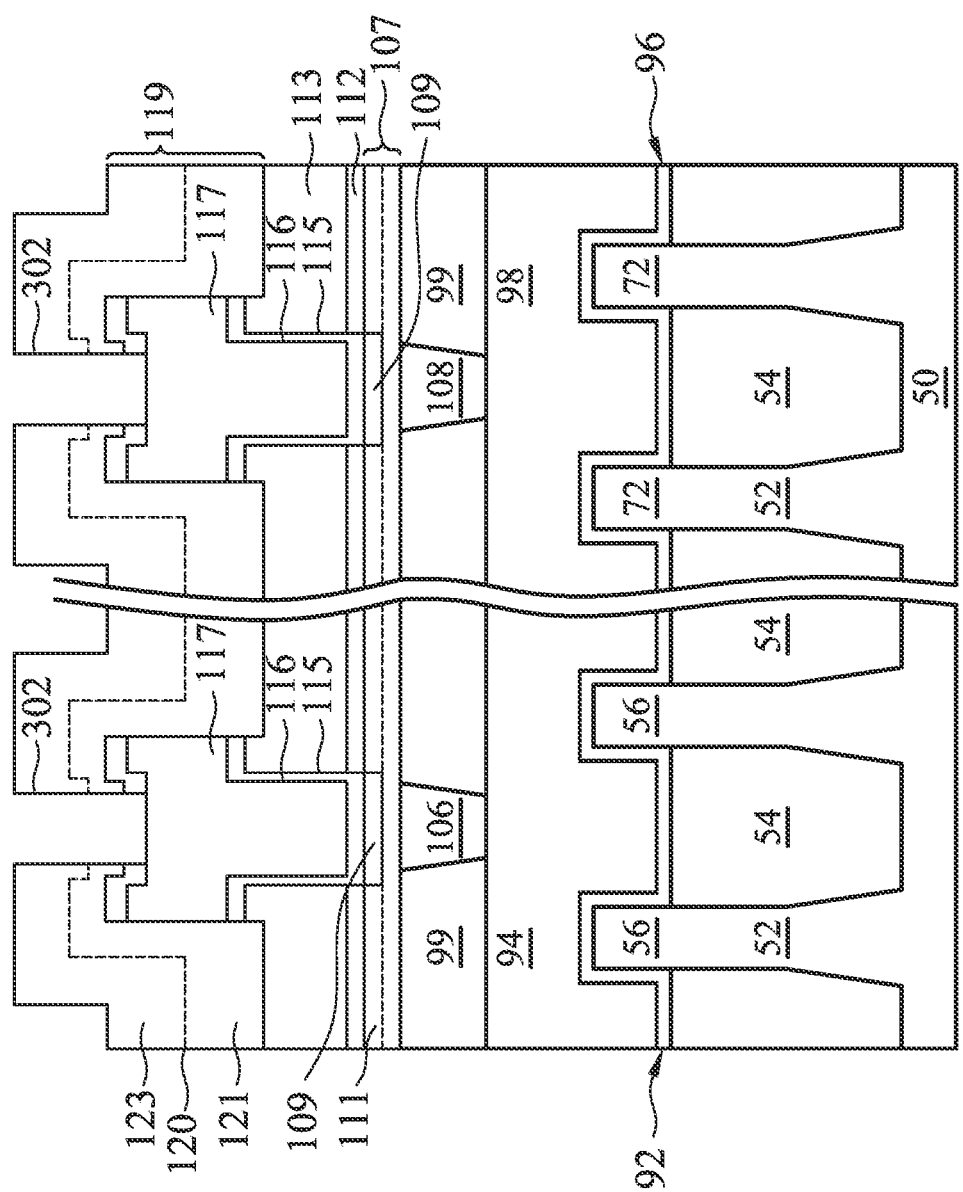
Figure 18C:
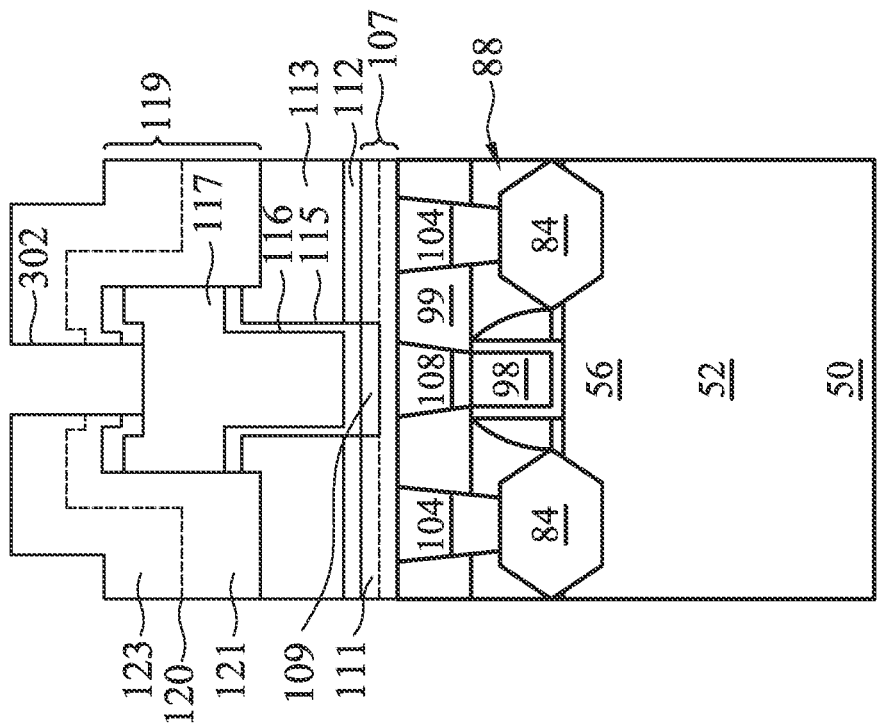
Figure 18B:
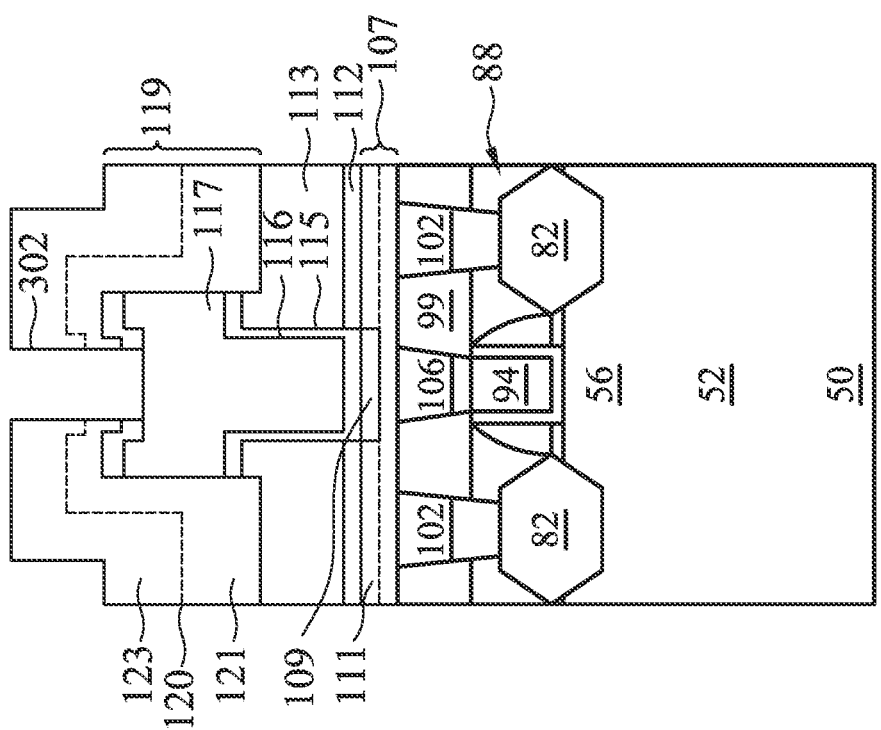

In FIGS. 18A, 18B, and 18C, the first passivation layer 113 and the second passivation layer 119 are formed over the ILD 99. Once the first passivation layer 113 and the second passivation layer 119 have been formed, the second passivation layer 119 may be patterned as described above with respect to FIGS. 1-3B in order to help remove the by-products 303 and avoid defects associated with the by-products 303 in an efficient process.

In accordance with an embodiment, a method of manufacturing a semiconductor device comprising forming a dielectric layer over a semiconductor substrate and patterning a photoresist over the dielectric layer is provided. The semiconductor substrate and the photoresist are placed into an etching chamber, and the pattern of the photoresist is transferred to the dielectric layer using an etching process. The photoresist is removed prior to removing the photoresist from the etching chamber.

In accordance with another embodiment, a method of manufacturing a semiconductor device comprising depositing a photoresist onto a dielectric material over a substrate and patterning the photoresist is provided. The dielectric material is etched through the photoresist, wherein the etching the dielectric material uses oxygen from a first source of oxygen as at least one reactant. The photoresist is removed after the etching the dielectric material, wherein the removing the photoresist uses oxygen from the first source of oxygen.

In accordance with yet another embodiment, a method of manufacturing a semiconductor device comprising patterning a photoresist to expose a dielectric material and form a patterned photoresist is provided. The dielectric material is dry etched through the patterned photoresist, and directly after the dry etching the dielectric material, a liner removal process is performed. Directly after the liner removal process, the photoresist is ashed, wherein the dry etching, the liner removal process, and the ashing are performed within a single etching chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

FinFET devices.

What is claimed is:

1. A method of manufacturing a semiconductor device, the method comprising:
    placing a semiconductor substrate into a first chamber;
    prior to removing the semiconductor substrate from the first chamber, etching a passivation layer through a photoresist layer;
    prior to removing the semiconductor substrate from the first chamber, performing a liner removal process to expose an external connection through the passivation layer, wherein after the liner removal process reaction by-products are present along sidewalls of the passivation layer, and wherein a first portion of the external connection has a sidewall aligned with a dielectric material, a second portion of the external connection being embedded within the dielectric material; and
    prior to removing the semiconductor substrate from the first chamber, removing the photoresist layer and the reaction by-products.

2. The method of claim 1, wherein the etching the passivation layer comprises:
    a chucking step with a first set of parameters;
    a main etching step with a second set of parameters different from the first set of parameters; and
    an overetching step.

3. The method of claim 2, wherein the main etching step further comprises:
    a first etching step introducing a first etchant; and
    a second etching step wherein a flow rate of the first etchant is ended.

4. The method of claim 1, wherein the etching the passivation layer forms an opening, the opening having a width between about 1 μm and about 10 μm.

5. The method of claim 1, wherein the removing the photoresist layer and the reaction by-products is performed with oxygen as an only etchant.

6. The method of claim 5, wherein the removing the photoresist layer and the reaction by-products is performed at a pressure between about 50 mT and about 1000 mT.

7. The method of claim 6, wherein the oxygen is introduced at a flow rate of between about 500 sccm and about 1800 sccm.

8. A method of manufacturing a semiconductor device, the method comprising:
    applying a photoresist to a passivation layer over an external contact over a semiconductor substrate;
    removing the photoresist, the removing the photoresist comprising:
        a pre-heating removal step with a first set of process conditions;
        a stabilization ashing step with a second set of process conditions different from the first set of process conditions; and
        a stripping step with a third set of process conditions different from the first set of process conditions and different from the second set of process conditions, the stripping step removing both the photoresist as well as reaction by-products from a previous etching process.

9. The method of claim 8, wherein the passivation layer is a composite layer.

10. The method of claim 9, wherein the composite layer comprises:
    a first layer with a first material and a first thickness between about 2 KÅ and about 4 KÅ; and
    a second layer with a second material and a second thickness between about 2 KÅ and about 6 KÅ, the second material being different from the first material.

11. The method of claim 8, wherein the first set of process conditions comprises:
    a pressure between about 500 mT and about 6000 mT;
    a temperature between about 50° C. and about 200° C.; and
    an etchant flow rate between about 100 sccm and about 9000 sccm.

12. The method of claim 8, wherein the second set of process conditions comprises a second pressure between about 50 mT and about 1500 mT.

13. The method of claim 12, wherein the second set of process conditions further comprises a second flow rate between about 500 sccm and about 5400 sccm.

14. The method of claim 8, further comprising a liner removal step.

15. The method of claim 14, wherein the liner removal step comprises:
a ramping step; and
a removal step, wherein the removal step is performed with a higher pressure than the ramping step.

16. A method of manufacturing a semiconductor device, the method comprising:
placing a semiconductor substrate into a first chamber;
etching a passivation layer through a photoresist layer;
performing a liner removal process to expose an external connection through the passivation layer, wherein after the liner removal process reaction by-products are present along sidewalls of the passivation layer; and
removing the photoresist and the reaction by-products, wherein the etching, the performing, and the removing are each performed in a first chamber, and wherein the removing further comprises:
performing a heating step with a first set of process conditions;
modifying the first set of process conditions to a second set of process conditions in a stabilization step; and
modifying the second set of process conditions to a third set of process conditions in a stripping step, the stripping step removing both the photoresist as well as the reaction by-products from a previous etching process.

17. The method of claim 16, wherein the first set of process conditions comprises:
a pressure between about 500 mT and about 6000 mT;
a temperature between about 50° C. and about 200° C.; and
an etchant flow rate between about 100 sccm and about 9000 sccm.

18. The method of claim 17, wherein the second set of process conditions comprises a second pressure between about 50 mT and about 1500 mT.

19. The method of claim 18, wherein the second set of process conditions further comprises a second flow rate between about 500 sccm and about 5400 sccm.

20. The method of claim 16, wherein within the stripping step oxygen is an only etchant utilized.

* * * * *